(12) United States Patent
Chou

(10) Patent No.: US 11,985,816 B2
(45) Date of Patent: May 14, 2024

(54) SEMICONDUCTOR DEVICE WITH AIR GAP

(71) Applicant: NANYA TECHNOLOGY CORPORATION, New Taipei (TW)

(72) Inventor: Liang-Pin Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 19 days.

(21) Appl. No.: 17/542,758

(22) Filed: Dec. 6, 2021

(65) Prior Publication Data
US 2023/0180462 A1 Jun. 8, 2023

(51) Int. Cl.
*H10B 12/00* (2023.01)
*H01L 21/768* (2006.01)

(52) U.S. Cl.
CPC ....... *H10B 12/482* (2023.02); *H01L 21/7682* (2013.01); *H01L 21/76829* (2013.01); *H01L 21/76852* (2013.01); *H10B 12/488* (2023.02)

(58) Field of Classification Search
CPC ........... H01L 21/7682; H01L 21/76829; H01L 21/76852; H01L 21/76831; H01L 21/76897; H10B 12/482; H10B 12/488; H10B 12/0335
See application file for complete search history.

(56) References Cited

U.S. PATENT DOCUMENTS

| | | | |
|---|---|---|---|
| 2001/0050386 A1* | 12/2001 | Suzuki | H01L 21/76838 257/E21.507 |
| 2005/0014319 A1* | 1/2005 | Yamazaki | H01L 27/1292 257/E21.414 |
| 2010/0003799 A1* | 1/2010 | Lee | H01L 21/26506 438/305 |
| 2013/0161832 A1* | 6/2013 | Cho | H10B 12/482 257/E21.59 |
| 2016/0351501 A1 | 12/2016 | Chun | |
| 2019/0103302 A1* | 4/2019 | Yoon | H10B 12/482 |
| 2021/0134803 A1* | 5/2021 | Cho | H10B 12/30 |
| 2021/0375878 A1* | 12/2021 | Zhang | H01L 21/7682 |
| 2022/0310909 A1 | 9/2022 | Maldonado-Garcia et al. | |

FOREIGN PATENT DOCUMENTS

| | | |
|---|---|---|
| CN | 210607254 U | 5/2020 |
| CN | 112382632 A | 2/2021 |
| CN | 113035869 A | 6/2021 |
| TW | 202145535 A | 12/2021 |

* cited by examiner

*Primary Examiner* — Nicholas J Tobergte
*Assistant Examiner* — Kevin Quinto
(74) *Attorney, Agent, or Firm* — MUNCY, GEISSLER, OLDS & LOWE, P.C.

(57) ABSTRACT

The present application discloses a semiconductor device and a method for fabricating the semiconductor device. The semiconductor device includes a substrate; a drain region positioned in the substrate; a common source region positioned in the substrate and opposing to the drain region; a bit line structure including a bit line conductive layer positioned on the substrate and electrically coupled to the common source region; a cell contact positioned on the substrate, adjacent to the bit line structure, and electrically connected to the drain region; a landing pad positioned above the bit line conductive layer and electrically connected to the cell contact; and an air gap positioned between the landing pad and the bit line conductive layer.

17 Claims, 20 Drawing Sheets

SEMICONDUCTOR DEVICE WITH AIR GAP

TECHNICAL FIELD

The present disclosure relates to a semiconductor device, and more particularly, to a semiconductor device with an air gap.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a drain region positioned in the substrate; a common source region positioned in the substrate and opposing to the drain region; a bit line structure including a bit line conductive layer positioned on the substrate and electrically coupled to the common source region; a cell contact positioned on the substrate, adjacent to the bit line structure, and electrically connected to the drain region; a landing pad positioned above the bit line conductive layer and electrically connected to the cell contact; and an air gap positioned between the landing pad and the bit line conductive layer.

Another aspect of the present disclosure provides a semiconductor device including a bit line structure including: a bit line conductive layer, and a bit line inner capping layer including a lower portion positioned on the bit line conductive layer and an upper portion positioned on the lower portion; a landing pad positioned above the bit line inner capping layer; and an air gap positioned between the landing pad and the bit line conductive layer, and adjacent to the upper portion of the bit line inner capping layer. A width of the upper portion of the bit line inner capping layer is less than a width of the bit line conductive layer.

Another aspect of the present disclosure provides a method for fabricating a semiconductor device including providing a substrate; forming a bit line conductive layer on the substrate and a bit line inner capping layer on the bit line conductive layer, wherein the bit line conductive layer and the bit line inner capping layer together configure a bit line structure; forming a bit line spacer capping layer covering the bit line structure; forming a cell contact adjacent to the bit line structure; forming a blanket pad layer on the bit line spacer capping layer and the cell contact; forming a plurality of pad openings along the blanket pad layer and extending to the bit line spacer capping layer and the bit line inner capping layer to turn the blanket pad layer into a plurality of landing pads; and selectively forming a sealing layer on the plurality of landing pads and covering upper portions of the plurality of pad openings to form a plurality of air gaps between the bit line conductive layer and the plurality of landing pads.

Due to the design of the semiconductor device of the present disclosure, the air gap may be formed between the landing pad and the bit line conductive layer. As a result, the parasitic capacitance between the landing pad and the bit line conductive layer may be reduced. Accordingly, the power consumption of the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
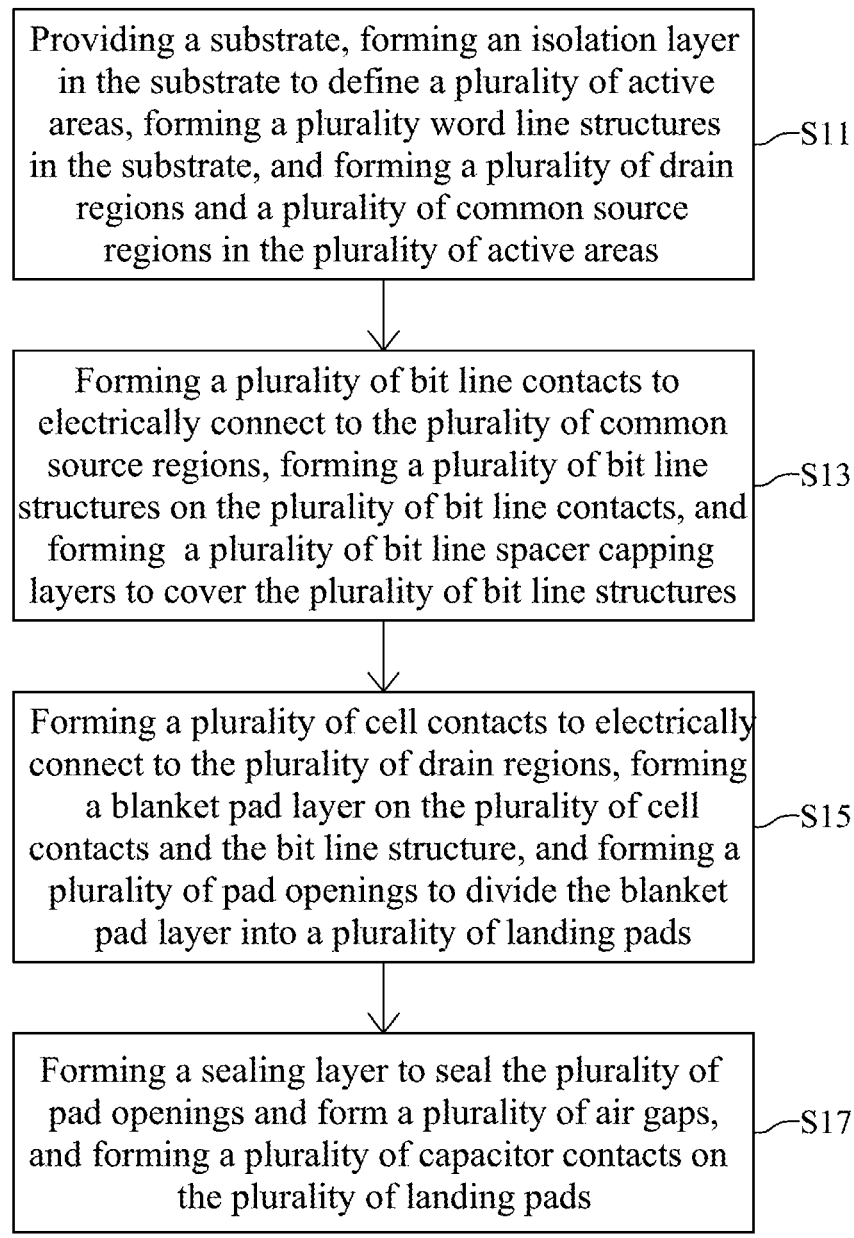
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that t, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
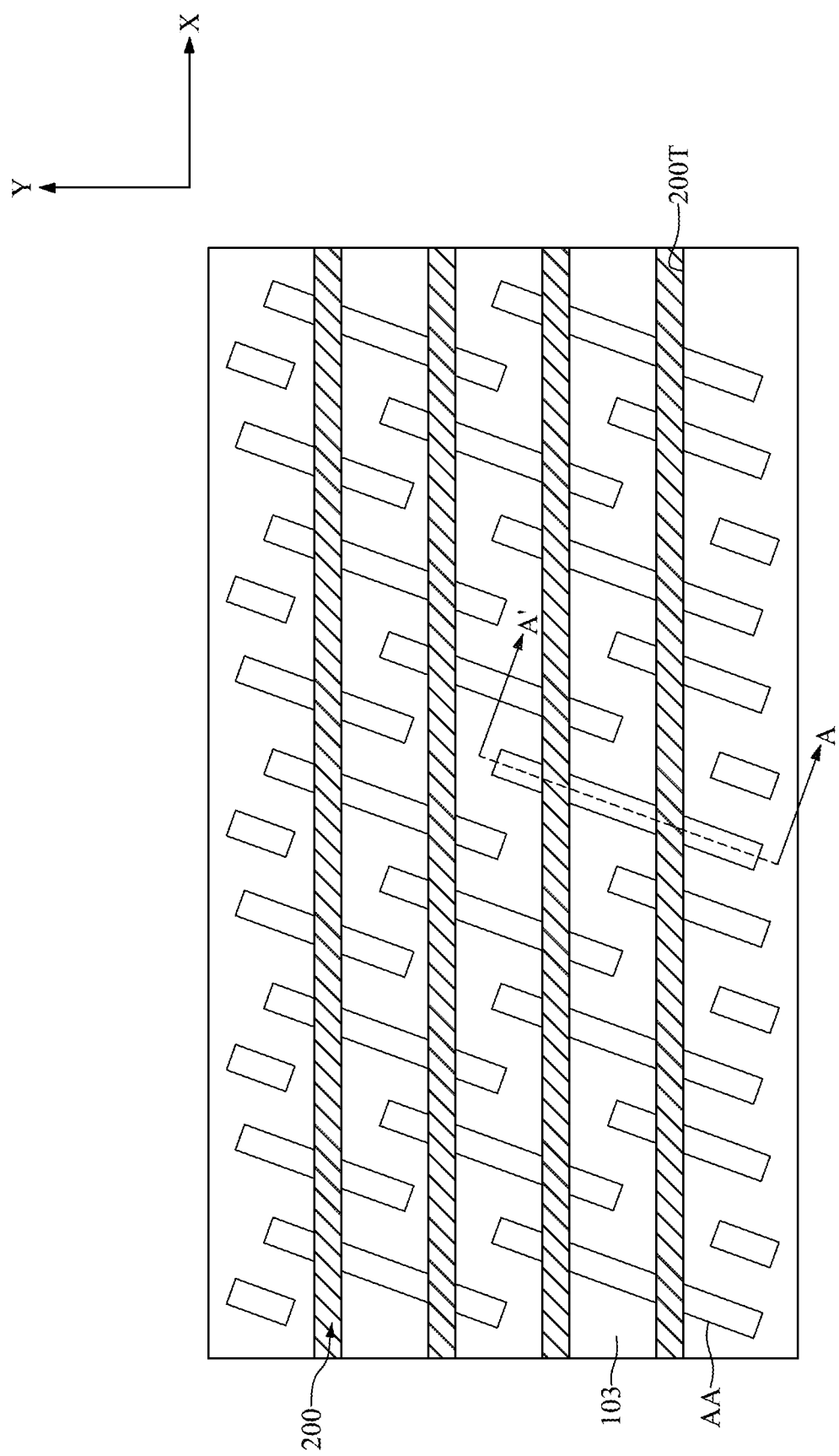
FIG. 2 illustrates, in a schematic top-view diagram, an intermediate semiconductor device in accordance with one embodiment of the present disclosure.
Figure 3:
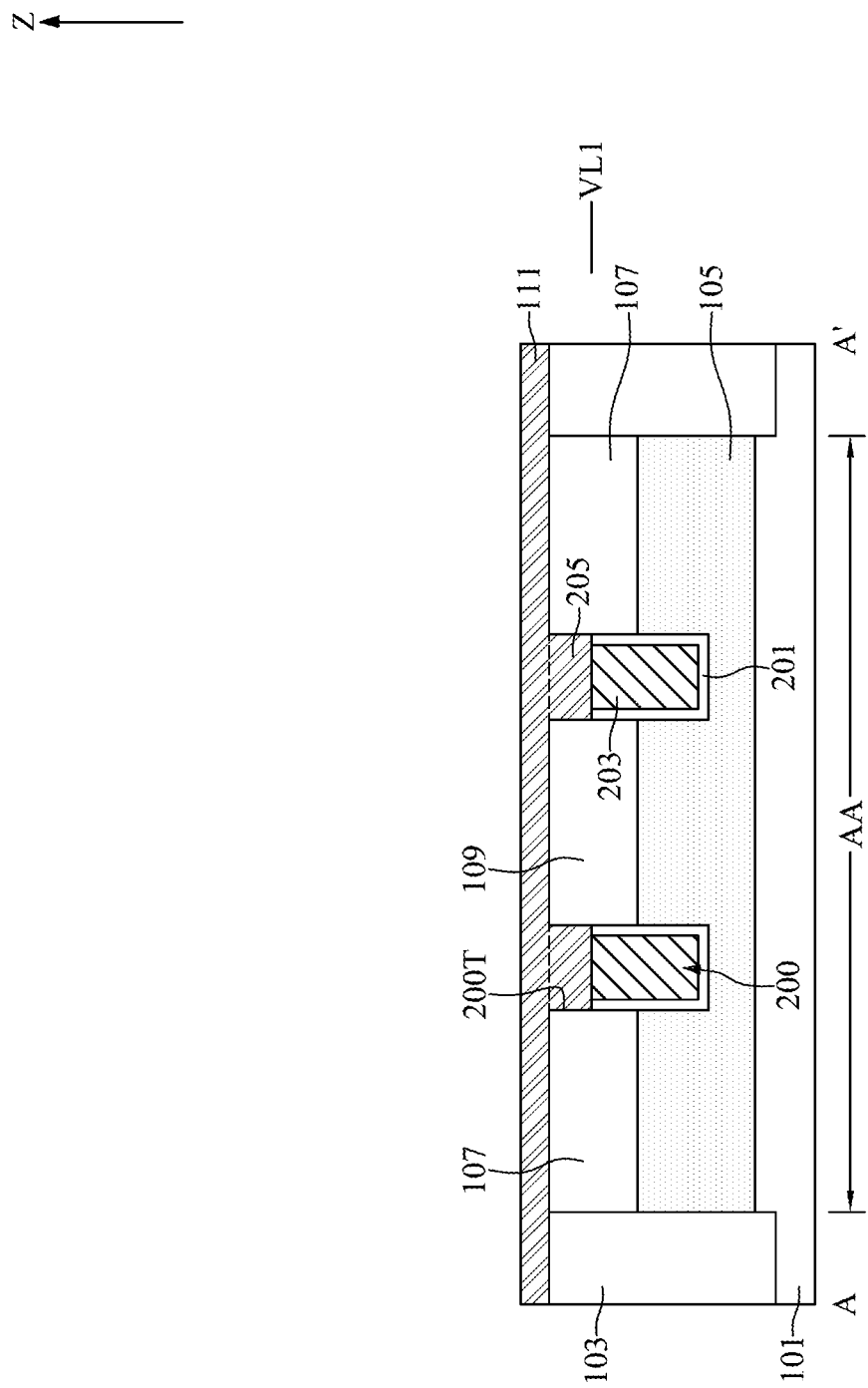
FIG. 3 is a schematic cross-sectional view diagram taken along a line A-A' in FIG. 2 illustrating part of a flow for fabricating the semiconductor device in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2 illustrating part of a flow for fabricating the semiconductor device 1A in accordance with one embodiment of the present disclosure. It should be noted that some elements are omitted in top-view diagrams for clarity.

With reference to FIGS. 1 to 3, at step S11, a substrate 101 may be provided, an isolation layer 103 may be formed in the substrate 101 to define a plurality of active areas AA, a plurality of word line structures 200 may be formed in the substrate 101, and a plurality of drain regions 107 and a plurality of common source regions 109 may be formed in the plurality of active areas AA.

With reference to FIGS. 2 and 3, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or 1I-VI compound semiconductor; or combinations thereof.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, a series of deposition processes may be performed to deposit a pad oxide layer (not shown for clarity) and a pad nitride layer (not shown for clarity) on the substrate 101. A photolithography process may be performed to define the position of the isolation layer 103. After the photolithography process, an etch process, such as an anisotropic dry etch process, may be performed to form trenches penetrating through the pad oxide layer, the pad nitride layer, and the substrate 101. An insulating material such as silicon oxide, silicon nitride, silicon oxynitride, or silicon nitride oxide may be deposited into the trenches and a planarization process, such as chemical mechanical polishing, may be subsequently performed to remove excess filling material until a top surface of the substrate 101 is exposed so as to form the isolation layer 103. The top surface of the isolation layer 103 and the top surface of the substrate 101 may be substantially coplanar. The isolation layer 103 may define the plurality of active areas AA in the substrate 101. In some embodiments, the plurality of active areas AA may extend along a direction slant with respective to the direction X and the direction Y.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

For brevity, clarity, and convenience of description, only elements in one active area AA are described. All other active areas AA may have the same elements and may have the same configuration.

With reference to FIGS. 2 and 3, a well region 105 may be formed in the active area AA. The well region 105 may be formed by an implantation using, for example, p-type dopants. The well region 105 may have a first electrical type (i.e., the p-type). The term "p-type dopant" refers to an impurity that when added to an intrinsic semiconductor material creates to deficiencies of valence electrons. In a silicon containing semiconductor material, examples of p-type dopants include, but are not limited to, boron, aluminum, gallium and/or indium.

With reference to FIGS. 2 and 3, an impurity region (not show in FIGS. 2 and 3) may be formed in the active area AA and on the well region 105. The impurity region will turn into the drain regions 107 and the common source region 109 as will be illustrated later. The impurity region may be formed by an implantation using, for example, n-type dopants. The term "n-type dopant" refers to an impurity that when added to an intrinsic semiconductor material contributes free electrons to the intrinsic semiconductor material. In a silicon containing material, examples of n-type dopants include, but are not limited to, antimony, arsenic and/or phosphorus. The impurity region may have a second electrical type (i.e., the n-type) different from the first electrical type of the well region 105. In some embodiments, the dopant concentration of the impurity region may be greater than the dopant concentration of the well region 105. In some embodiments, the concentration of dopants within the impurity region may be in a range from $4\times10^{20}$ atoms/cm$^3$ to $2\times10^{21}$ atoms/cm$^3$; although other dopant concentrations that are lesser than, or greater than, the aforementioned range may also be employed in the present application.

In some embodiments, an annealing process may be performed to activate the well region 105 and the impurity region. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

With reference to FIGS. 2 and 3, a plurality of trenches 200T may be formed in the substrate 101 to define the position of the plurality word line structures 200. The plurality of trenches 200T may be formed by an etch process using a mask pattern (not shown for clarity) formed on the substrate 101 as an etch mask. In some embodiments, the plurality of trenches 200T may have a line shape and extending along the direction X and traversing the plurality of active areas AA. For example, each active area AA may be intersected with two trenches 200T.

With reference to FIGS. 2 and 3, the impurity region may be divided into the two drain regions 107 and the common source region 109 by the two trenches 200T. The two drain regions 107 may be respectively formed between the two trenches 201T and the isolation layer 103. The common source region 109 may be formed between the two trenches 200T. The electric type and the dopant concentration of the two drain region 107 and the common source region 109 are the same as the electric type and the dopant concentration of the impurity region.

With reference to FIGS. 2 and 3, the plurality word line structures 200 (e.g., two word line structures 200) may be formed in the two trenches 200T, respectively and correspondingly. For brevity, clarity, and convenience of description, only one word line structure 200 is described. The plurality word line structures 200 may include a word line insulating layer 201, a word line conductive layer 203, and a word line capping layer 205.

With reference to FIGS. 2 and 3, the word line insulating layer 201 may be conformally form on the surface of the trench 200T. The word line insulating layer 201 may have a U-shaped cross-sectional profile. In other words, the word line insulating layer 201 may be inwardly formed in the substrate 101. In some embodiments, the word line insulating layer 201 may be formed by a thermal oxidation process. For example, the word line insulating layer 201 may be formed by oxidizing the surface of the trench 200T. In some embodiments, the word line insulating layer 201 may be formed by a deposition process such as a chemical vapor deposition or an atomic layer deposition. The word line insulating layer 201 may include a high-k material, an oxide, a nitride, an oxynitride or combinations thereof. In some embodiments, after a liner polysilicon layer is deposited, the word line insulating layer 201 may be formed by radical-oxidizing the liner polysilicon layer. In some embodiments, after a liner silicon nitride layer is formed, the word line insulating layer 201 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material.

With reference to FIGS. 2 and 3, the word line conductive layer 203 may be formed on the word line insulating layer 201. In some embodiments, in order to form the word line conductive layer 203, a conductive layer (not shown for clarity) may be formed to fill the trench 200T, and subsequently a recessing process may be performed. The recessing process may be performed as an etch-back process or sequentially performed as the planarization process and an etch-back process. The word line conductive layer 203 may have a recessed shape that partially fills the trench 200T. That is, the top surface of the word line conductive layer 203 may be at a vertical level VL1 lower than the top surface of the substrate 101.

In some embodiments, the word line conductive layer 203 may include a metal, a metal nitride, or a combination thereof. For example, the word line conductive layer 203 may be formed of titanium nitride, tungsten, or a titanium nitride/tungsten. After the titanium nitride is conformally formed, the titanium nitride/tungsten may have a structure where the trench 200T is partially filled using tungsten. The titanium nitride or the tungsten may be solely used for the word line conductive layer 203. In some embodiments, the word line conductive layer 203 may be formed of, for example, a conductive material such as polycrystalline silicon, polycrystalline silicon germanium, or a combination thereof. In some embodiments, the word line conductive layer 203 may be doped with a dopant such as phosphorus, arsenic, antimony, or boron. In some embodiments, the word line conductive layer 203 may be formed of, for example, tungsten, aluminum, titanium, copper, the like, or a combination thereof.

With reference to FIGS. 2 and 3, a first dielectric layer 111 may be formed to completely fill the plurality of trenches 200T and covering the top surface of the substrate 101. A planarization process, such as chemical mechanical polishing, may be performed to provide a substantially flat surface for subsequent processing steps. The portions of the first dielectric layer 111 filled in the plurality of trenches 200T may be referred to as the word line capping layers 205. In some embodiments, the first dielectric layer 111 and the word line capping layer 205 may be formed of, for example, silicon oxide, or silicon nitride and may be formed by a deposition process such as chemical vapor deposition.

Figure 4:
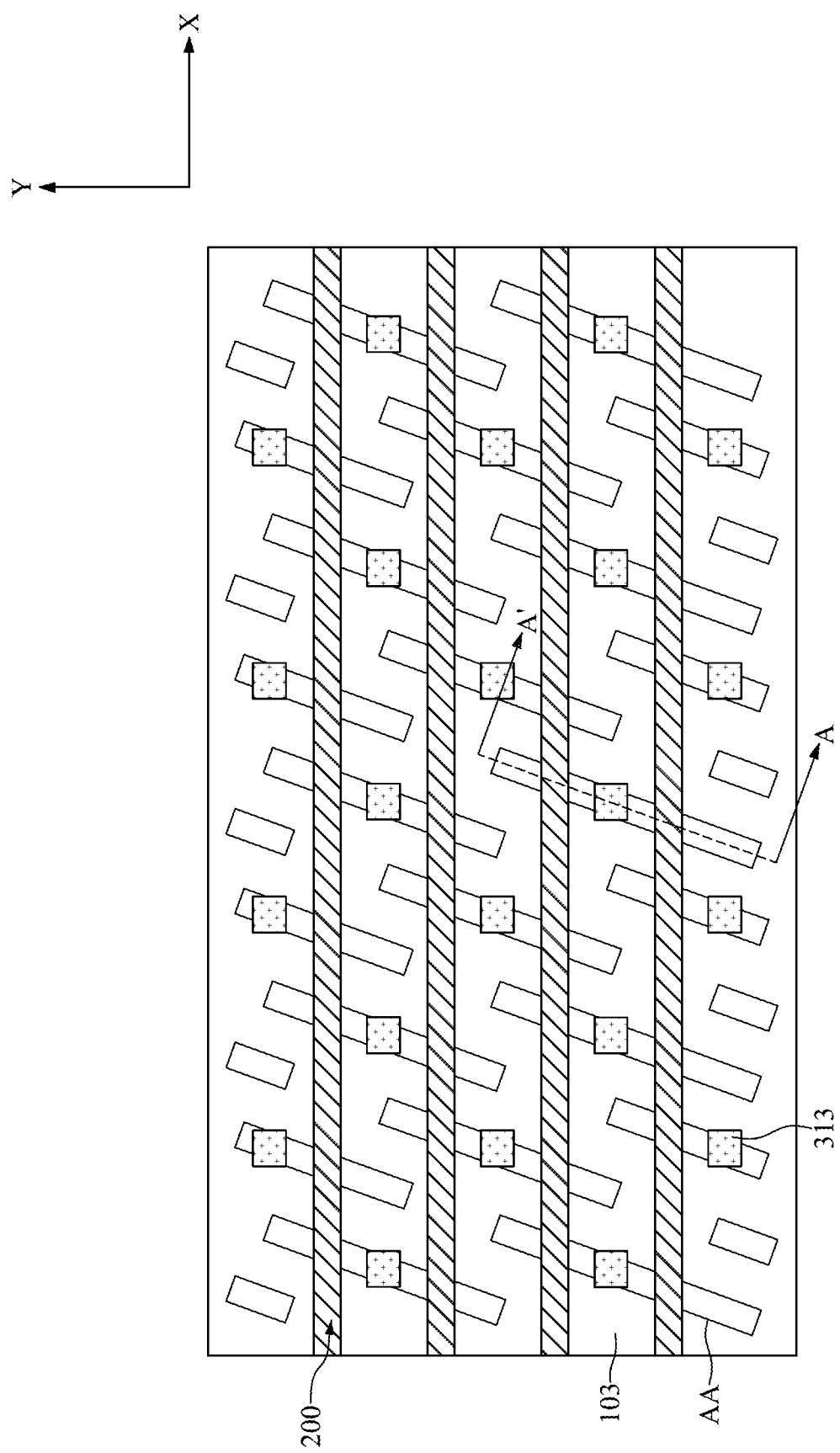
FIG. 4 illustrates, in a schematic top-view diagram, an intermediate semiconductor device in accordance with one embodiment of the present disclosure.
Figure 5:
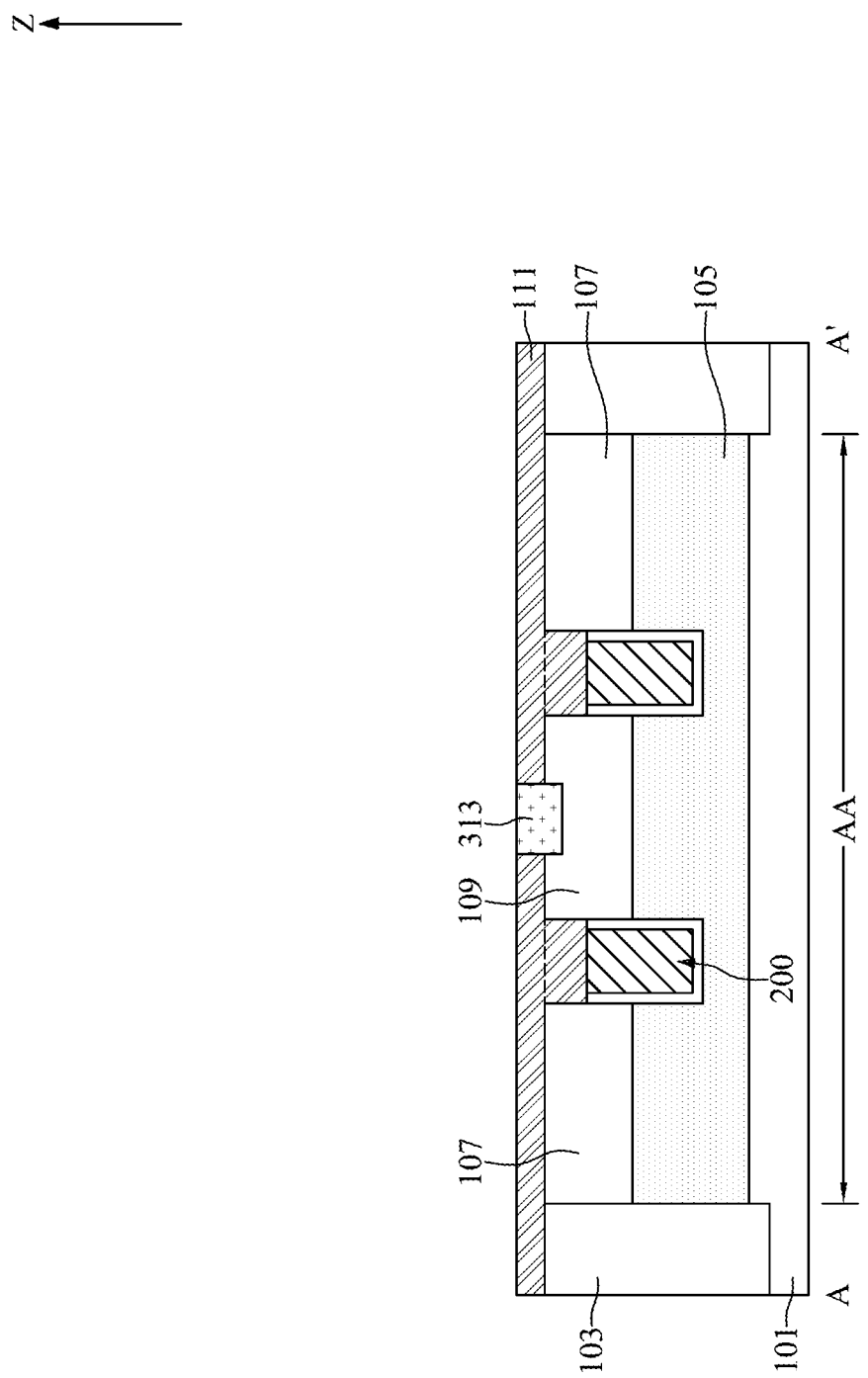
FIGS. 5 and 6 are schematic cross-sectional view diagrams taken along a line A-A' in FIG. 4 illustrating part of the flow for fabricating the semiconductor device in accordance with one embodiment of the present disclosure.
Figure 6:
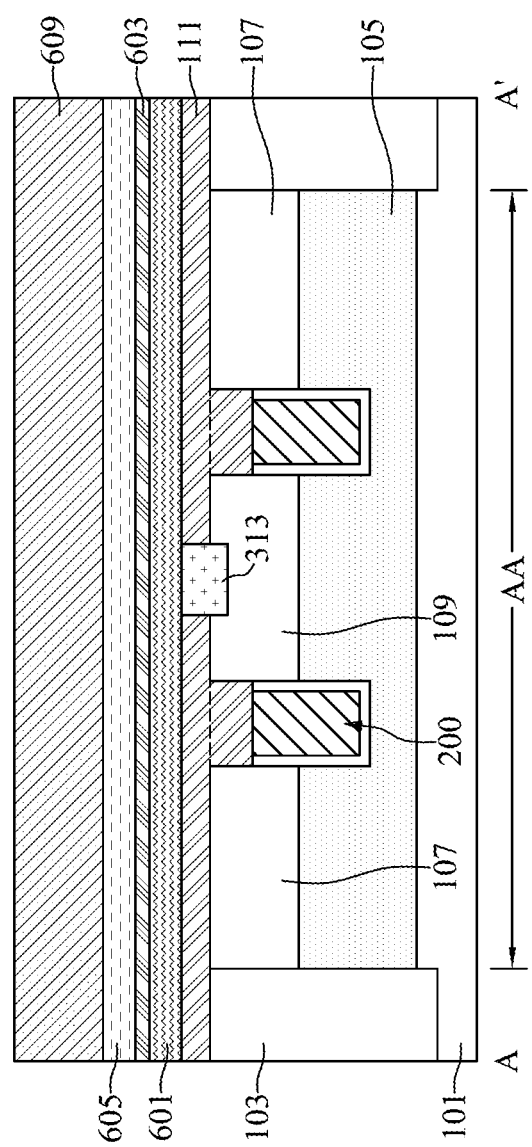

FIG. 4 illustrates, in a schematic top-view diagram, an intermediate semiconductor device in accordance with one embodiment of the present disclosure. FIGS. 5 and 6 are schematic cross-sectional view diagrams taken along a line A-A' in FIG. 4 illustrating part of the flow for fabricating the semiconductor device 1A in accordance with one embodiment of the present disclosure.

Figure 7:
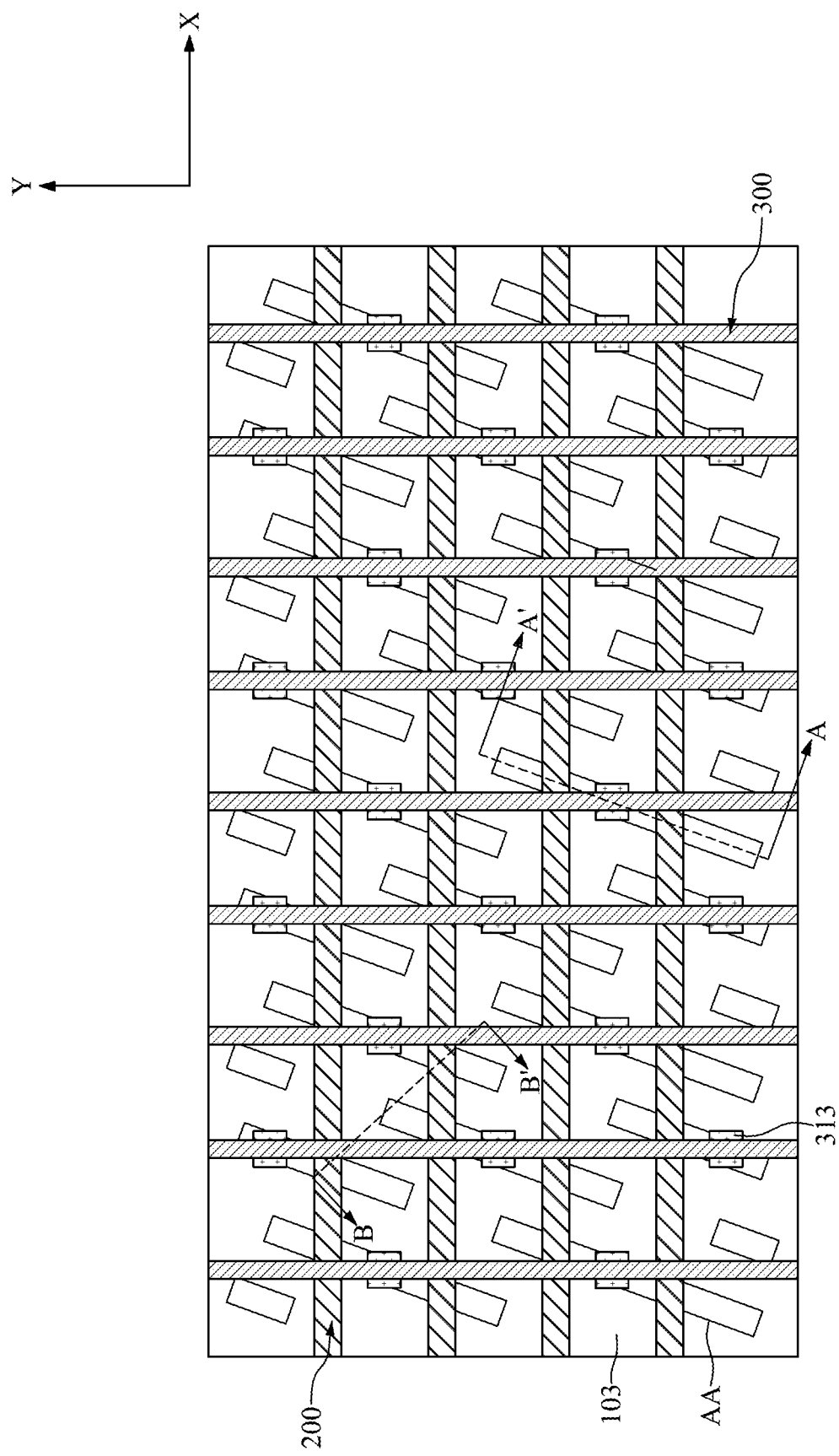
FIG. 7 illustrates, in a schematic top-view diagram, an intermediate semiconductor device in accordance with one embodiment of the present disclosure.

FIG. 7 illustrates, in a schematic top-view diagram, an intermediate semiconductor device in accordance with one embodiment of the present disclosure. FIGS. 8 to 11 are schematic cross-sectional view diagrams taken along a line A-A' in FIG. 7 illustrating part of the flow for fabricating the semiconductor device 1A in accordance with one embodiment of the present disclosure. FIG. 12 is a schematic cross-sectional view diagram taken along a line B-B' in FIG. 7 illustrating part of the flow for fabricating the semiconductor device 1A in accordance with one embodiment of the present disclosure.

With reference to FIG. 1 and FIGS. 4 to 12, at step S13, a plurality of bit line contacts 313 may be formed to electrically connect to the plurality of common source regions 109, a plurality of bit line structures 300 may be formed on the plurality of bit line contacts 313, and a plurality of bit line spacer capping layers 311 may be formed to cover the plurality of bit line structures 300.

For brevity, clarity, and convenience of description, only one bit line contact 313, one bit line structure 300, and one bit line spacer capping layer 311 are described.

With reference to FIGS. 4 and 5, the bit line contact 313 may be formed along the first dielectric layer 111, extending to the common source region 109, and electrically connected to the common source region 109. The bit line contact 313 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The bit line contact 313 may be formed by, for example, a damascene method.

With reference to FIG. 6, a layer of first conductive material 601, a layer of second conductive material 603, a layer of third conductive material 605, and a layer of first insulating material 609 may be sequentially formed on the first dielectric layer 111. The first conductive material 601 may be, for example, a doped semiconductor material such as doped silicon or doped germanium. The second conductive material 603 may be, for example, a conductive metal nitride (e.g., titanium nitride or tantalum nitride). The third conductive material 605 may be, for example, a metallic material (e.g., titanium, tantalum, tungsten, copper, or aluminum), or a metal-semiconductor compound (e.g., tungsten silicide, cobalt silicide, or titanium silicide). The first insulating material 609 may be, for example, silicon nitride, silicon oxynitride, silicon nitride oxide, the like, or a combination thereof. The layer of first conductive material 601, the layer of second conductive material 603, the layer of third conductive material 605, and the layer of first insulating material 609 may be formed by, for example, chemical vapor deposition, plasma enhanced chemical vapor deposition, atomic layer deposition, or other applicable deposition processes.

Figure 8:
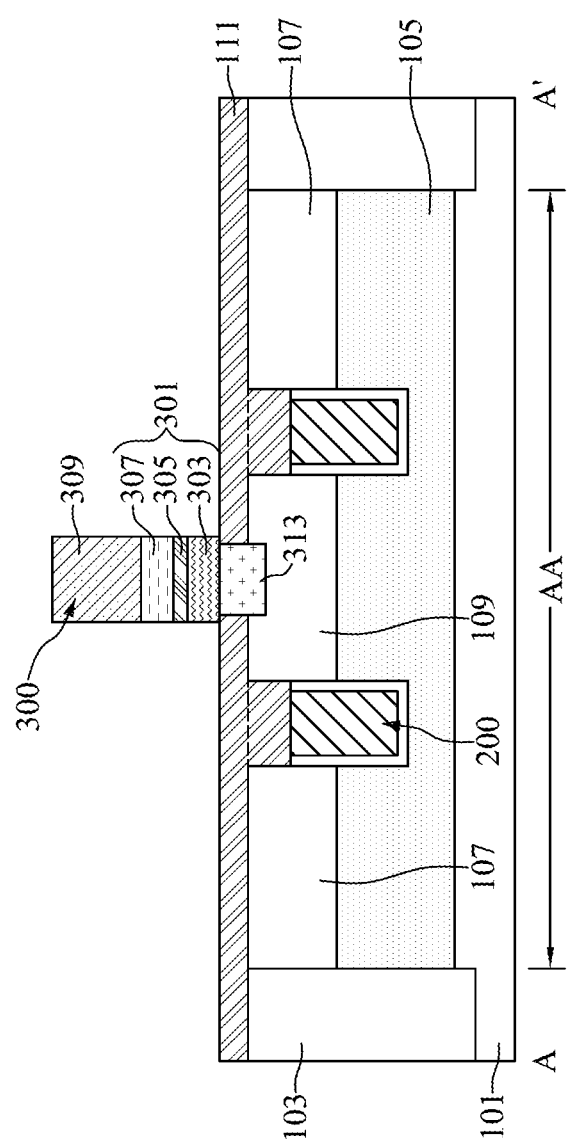
FIGS. 8 to 11 are schematic cross-sectional view diagrams taken along a line A-A' in FIG. 7 illustrating part of the flow for fabricating the semiconductor device in accordance with one embodiment of the present disclosure.

With reference to FIGS. 7 and 8, an etch process, such as an anisotropic dry etch process, may be performed with a bit line mask (not shown for clarity) as a pattern guide to remove portions of the layer of first insulating material 609, portions of the layer of third conductive material 605, portions of the layer of second conductive material 603, and portions of the layer of first conductive material 601. In some embodiments, the etch process may be a multistep etch process. After the etch process, the layer of first conductive material 601 may be turned into a bottom conductive portion 303, the layer of second conductive material 603 may be turned into a middle conductive portion 305, the layer of third conductive material 605 may be turned into a top conductive portion 307, and the layer of first insulating material 609 may be turned into a bit line inner capping layer 309. The bottom conductive portion 303, the middle conductive portion 305, and the top conductive portion 307 together configure a bit line conductive layer 301. The bit line conductive layer 301 and the bit line inner capping layer 309 together configure the bit line structure 300. In some embodiments, the bit line structure 300 may extend along the direction Y in a top-view perspective.

Figure 9:
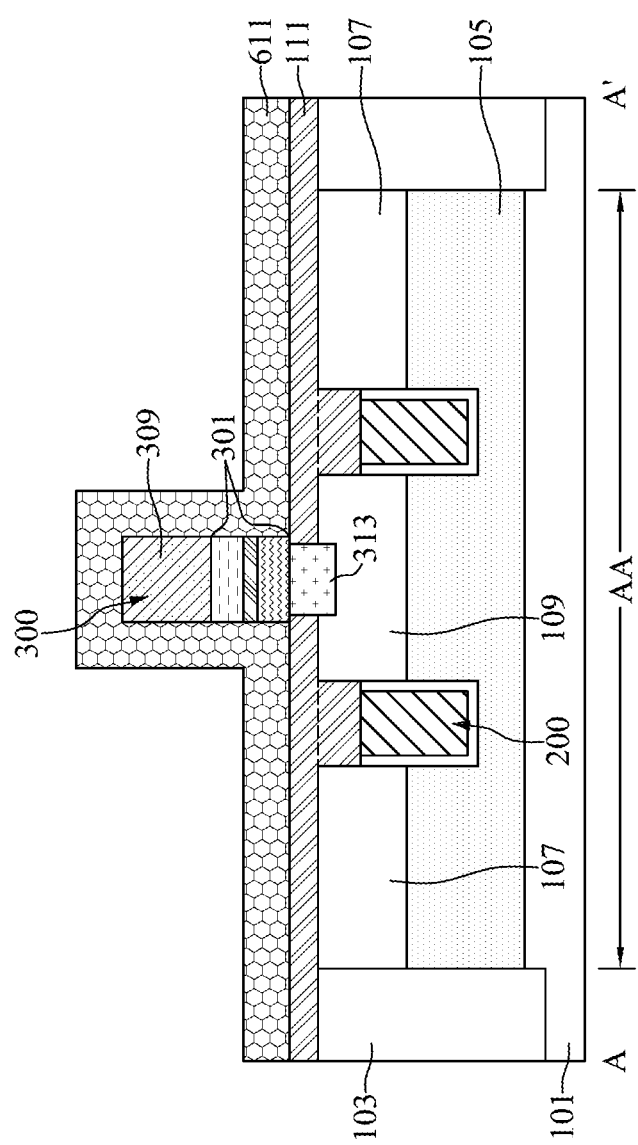

With reference to FIG. 9, a spacer layer 611 may be conformally formed to cover the first dielectric layer 111 and the bit line structure 300. In some embodiments, the spacer layer 611 may include silicon dioxide, silicon nitride, boron nitride, a semiconductor carbide, a semiconductor oxynitride, or a dielectric metal oxide. In some embodiments, the spacer layer 611 may be a stacked layer structure consisting of silicon oxide-silicon nitride-silicon oxide. The spacer layer 611 may be formed by a deposition process such as, for example, chemical vapor deposition, plasma enhanced chemical vapor deposition, or atomic layer deposition.

Figure 10:
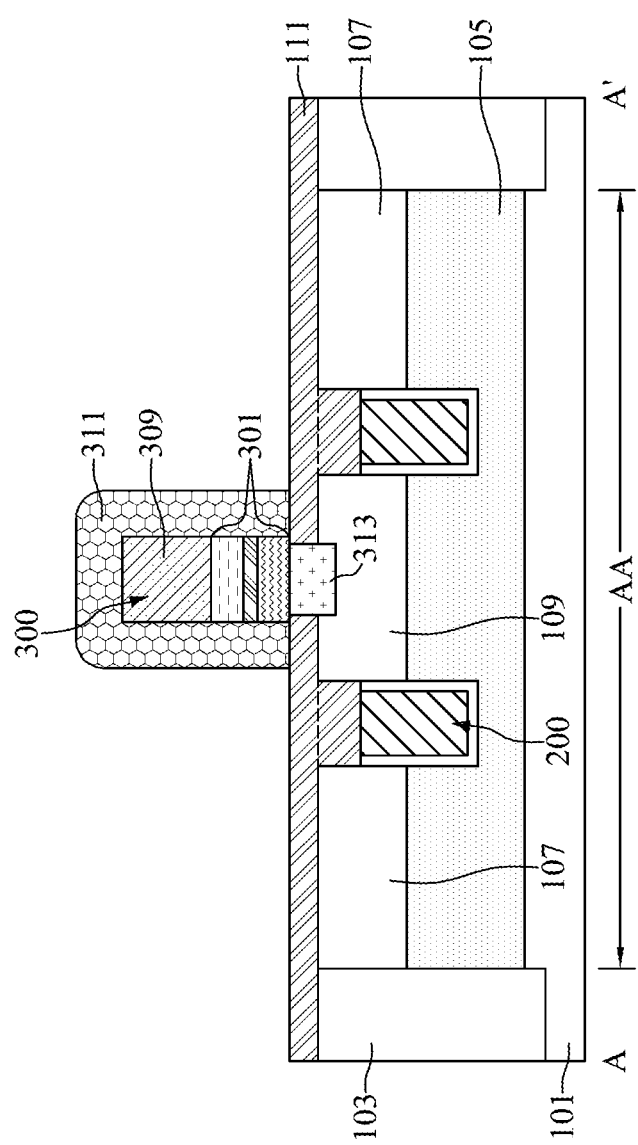

With reference to FIG. 10, a spacer etch process may be performed to remove the portions of the spacer layer 611 formed on the top surface of the first dielectric layer 111. The remaining spacer layer 611 may be referred to as the bit line spacer capping layer 311 covering the bit line structure 300. The spacer etch process may be, for example, an anisotropic etch process such as reactive ion etching. In some embodiments, the thickness of the bit line spacer capping layer 311 may be between about 200 angstroms and about 1000 angstroms. In some embodiments, the thickness of the plurality word line structures 200 may be between about 400 angstroms and about 800 angstroms.

It should be noted that the thickness of the bit line spacer capping layer 311 is not in scale to emphasis the presence of the bit line spacer capping layer 311.

Figure 11:
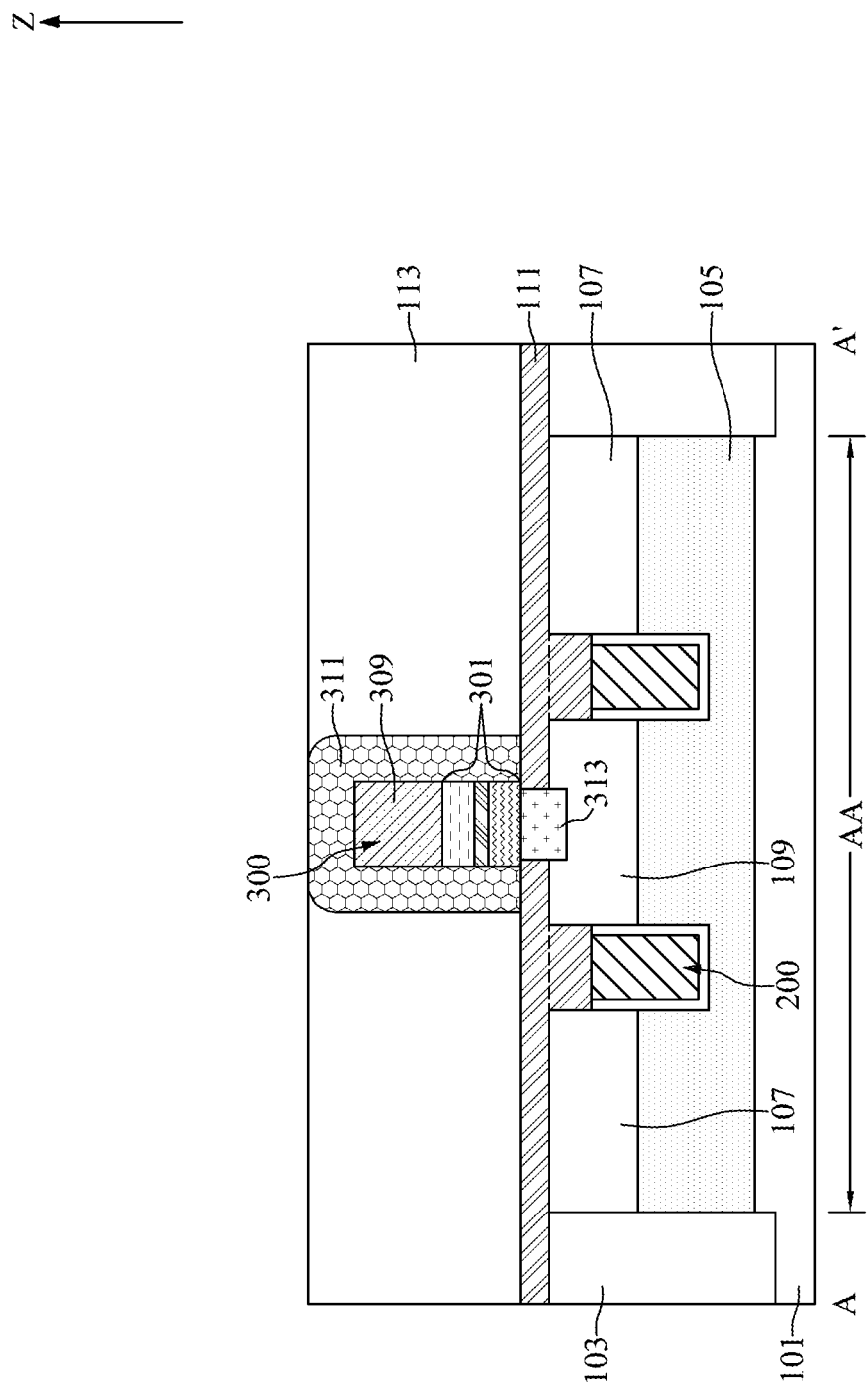
Figure 12:
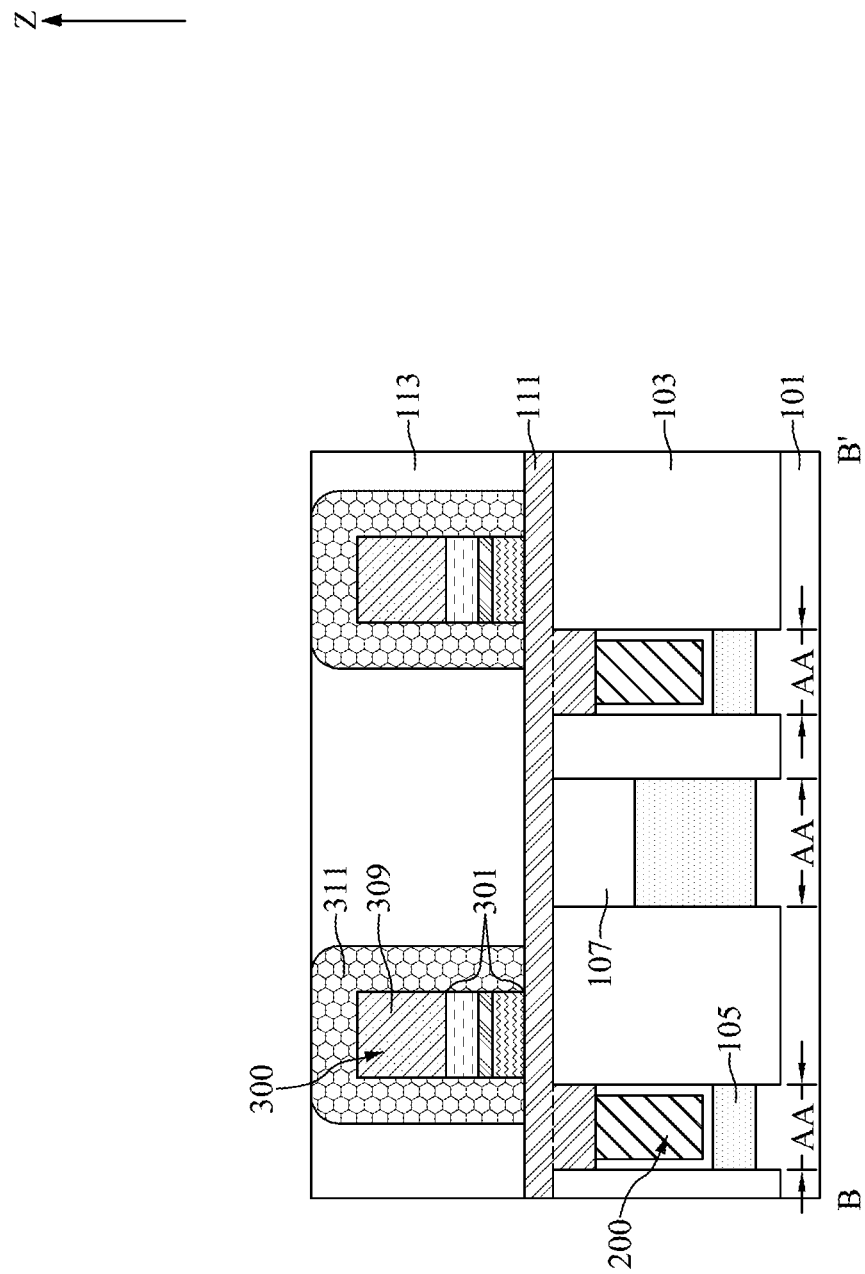
FIG. 12 is a schematic cross-sectional view diagram taken along a line B-B' in FIG. 7 illustrating part of the flow for fabricating the semiconductor device in accordance with one embodiment of the present disclosure.

With reference to FIGS. 11 and 12, a second dielectric layer 113 may be formed on the first dielectric layer 601 to cover the bit line structure 300. The second dielectric layer 113 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the second dielectric layer 113 may include a self-planarizing material such as a spin-on glass or a spin-on low-k dielectric material such as SiLK™. In some embodiments, the second dielectric layer 113 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

Figure 13:
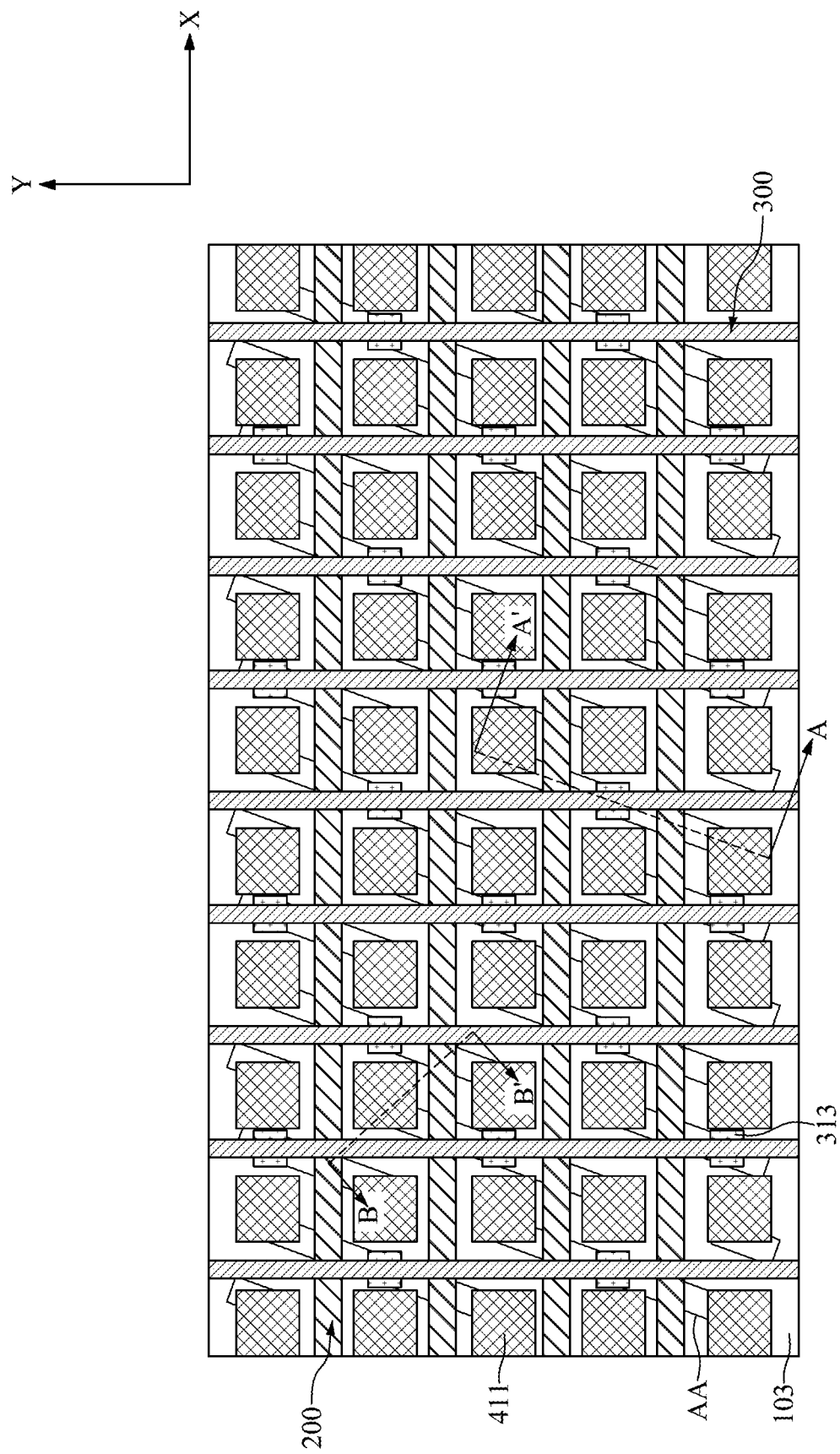
FIG. 13 illustrates, in a schematic top-view diagram, an intermediate semiconductor device in accordance with one embodiment of the present disclosure.
Figure 14:
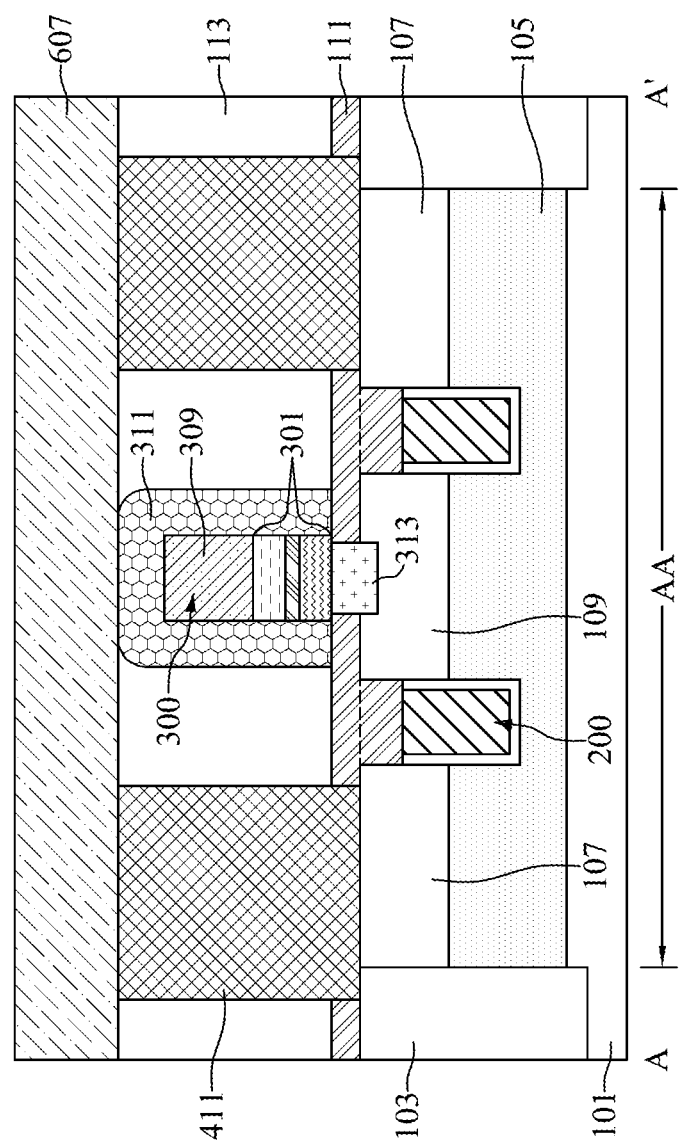
FIG. 14 is a schematic cross-sectional view diagram taken along a line A-A' in FIG. 13 illustrating part of the flow for fabricating the semiconductor device in accordance with one embodiment of the present disclosure.
Figure 15:
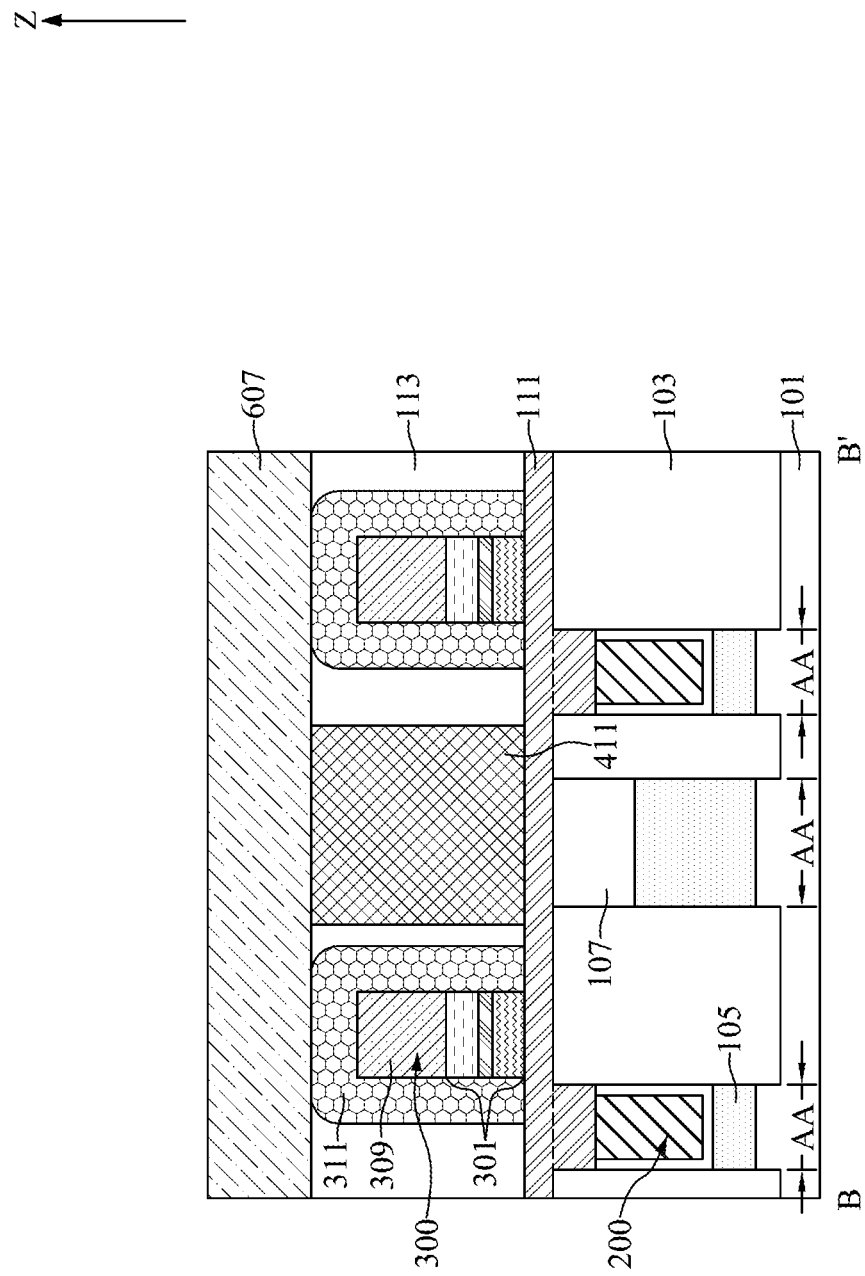
FIGS. 15 and 16 are schematic cross-sectional view diagram taken along a line B-B' in FIG. 13 illustrating part of the flow for fabricating the semiconductor device in accordance with one embodiment of the present disclosure.
Figure 16:
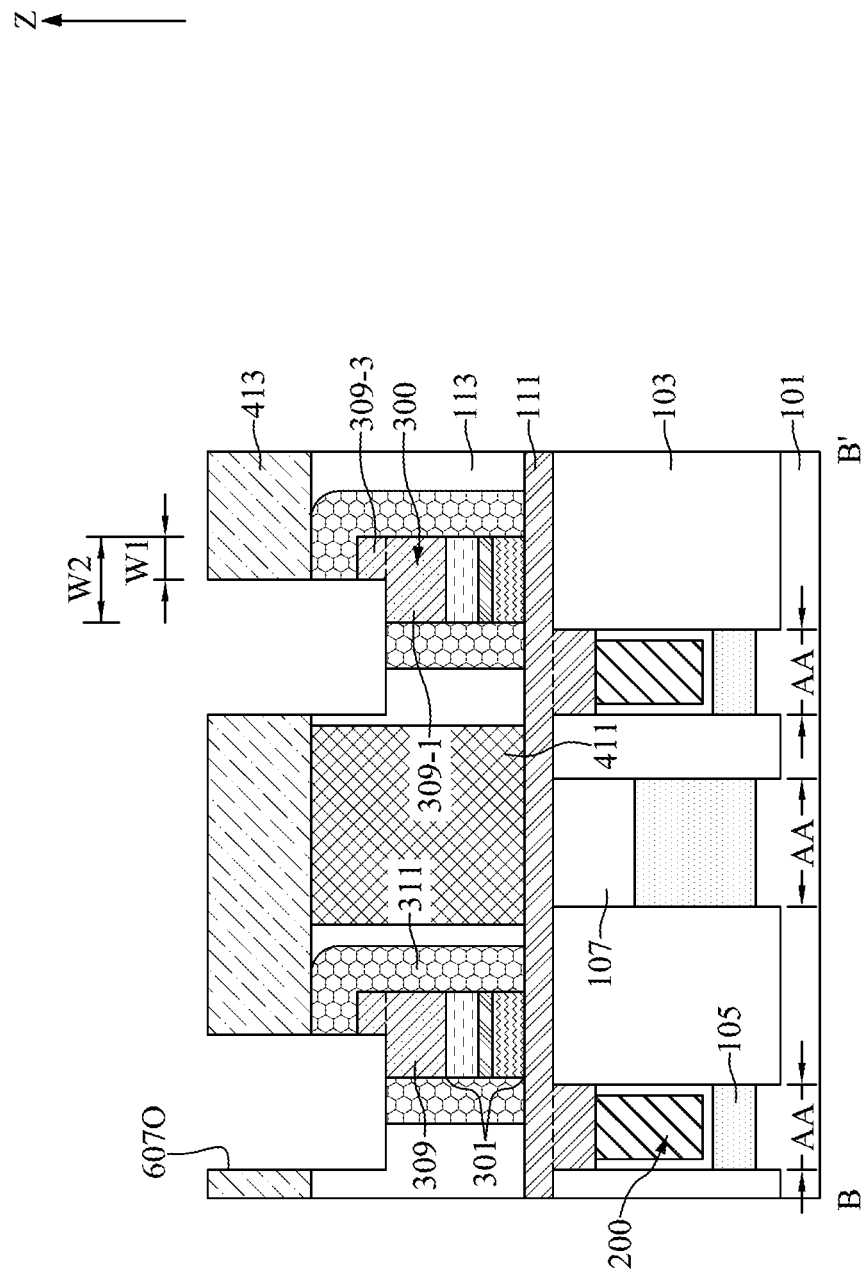

FIG. 13 illustrates, in a schematic top-view diagram, an intermediate semiconductor device in accordance with one embodiment of the present disclosure. FIG. 14 is a schematic cross-sectional view diagram taken along a line A-A' in FIG. 13 illustrating part of the flow for fabricating the semiconductor device 1A in accordance with one embodiment of the present disclosure. FIGS. 15 and 16 are schematic cross-sectional view diagram taken along a line B-B' in FIG. 13 illustrating part of the flow for fabricating the semiconductor device 1A in accordance with one embodiment of the present disclosure.

With reference to FIG. 1 and FIGS. 13 to 16, at step S15, a plurality of cell contacts 411 may be formed to electrically connect to the plurality of drain regions 107, a blanket pad layer 607 may be formed on the plurality of cell contacts 411 and the bit line structure 300, and a plurality of pad openings 607O may be formed to divide the blanket pad layer 607 into a plurality of landing pads 413.

With reference to FIGS. 13 to 15, the plurality of cell contacts 411 (e.g., two cell contacts 411) may be formed penetrating along the second dielectric layer 113 and the first dielectric layer 111, and on the two drain regions 107, respectively and correspondingly. The two cell contacts 411 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The two cell contacts 411 may be formed by, for example, a damascene method.

With reference to FIGS. 13 to 15, the blanket pad layer 607 may be formed on the second dielectric layer 113, the two cell contacts 411, and the bit line spacer capping layer 311. The blanket pad layer 607 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The blanket pad layer 607 may be formed by, for example, chemical vapor deposition, physical vapor deposition, or other applicable deposition process.

With reference to FIG. 16, a pad etch process may be performed to remove the portions of the blanket pad layer 607, portions of the bit line spacer capping layer 311, portions of the bit line inner capping layer 309, and portions of the second dielectric layer 113. In some embodiments, the pad etch process may be, for example, an anisotropic etch process. In some embodiments, the pad etch may include multiple etching steps to etch different material, respectively and correspondingly.

After the pad etch process, a plurality of pad openings 607O may be formed and the blanket pad layer 607 may be divided into the plurality of landing pads 413 through the plurality of pad openings 607O. The second dielectric layer 113, the bit line inner capping layer 309, and the bit line spacer capping layer 311 may be exposed to the pad opening 607O. In some embodiments, the bit line inner capping layer 309 may include a lower portion 309-1 and an upper portion 309-3. The lower portion 309-1 may be disposed on the bit line conductive layer 301. The top surface of the lower portion 309-1 and the bottom surface of the pad opening 607O substantially coplanar. The upper portion 309-3 may be disposed on the lower portion 309-1 and adjacent to the pad opening 607O. The width W1 of the upper portion 309-3 may be less than the width W2 of the bit line conductive layer 301.

Figure 17:
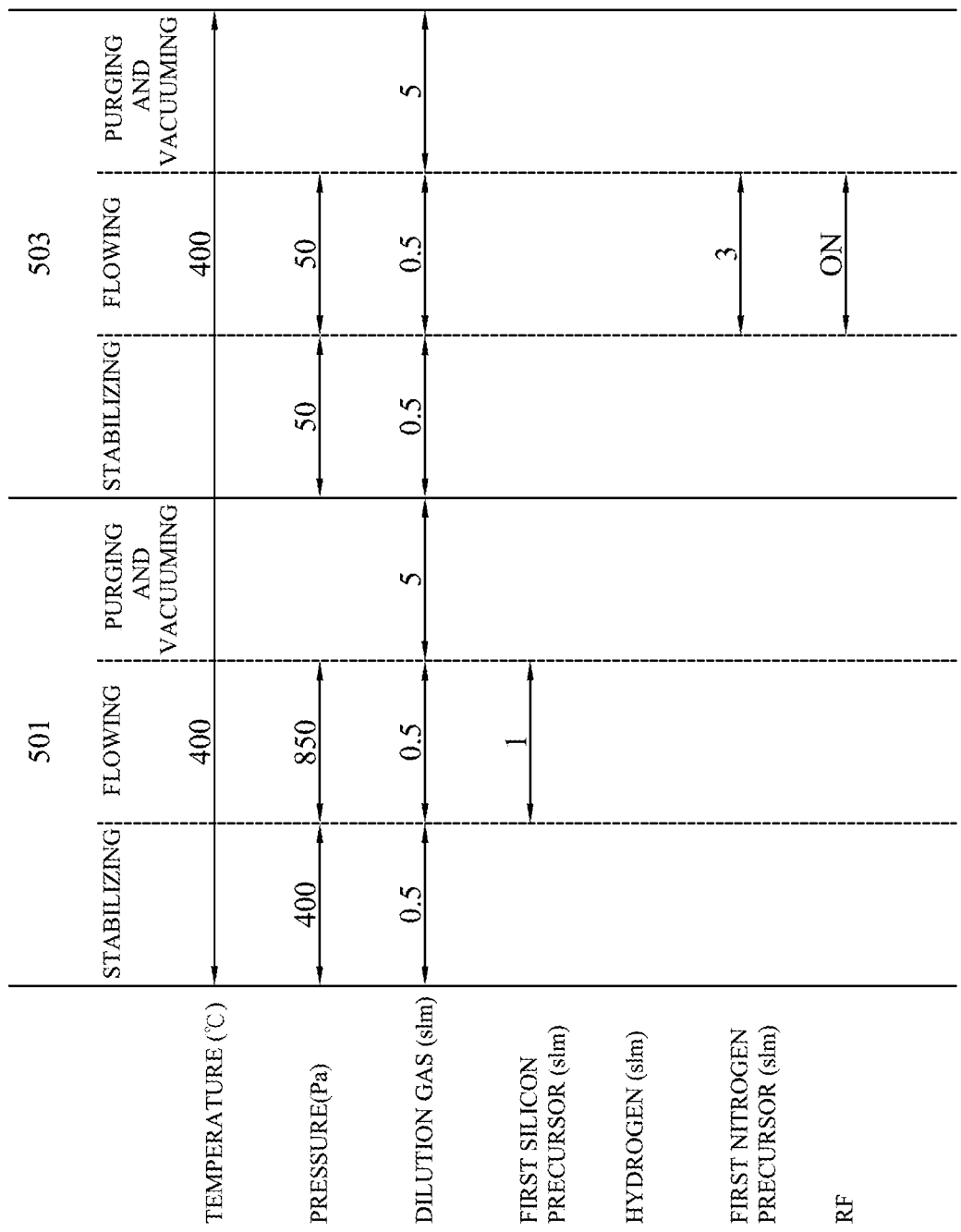
FIG. 17 is a chart showing an example of process conditions for forming a sealing layer of the semiconductor device in accordance with one embodiment of the present disclosure.
Figure 18:
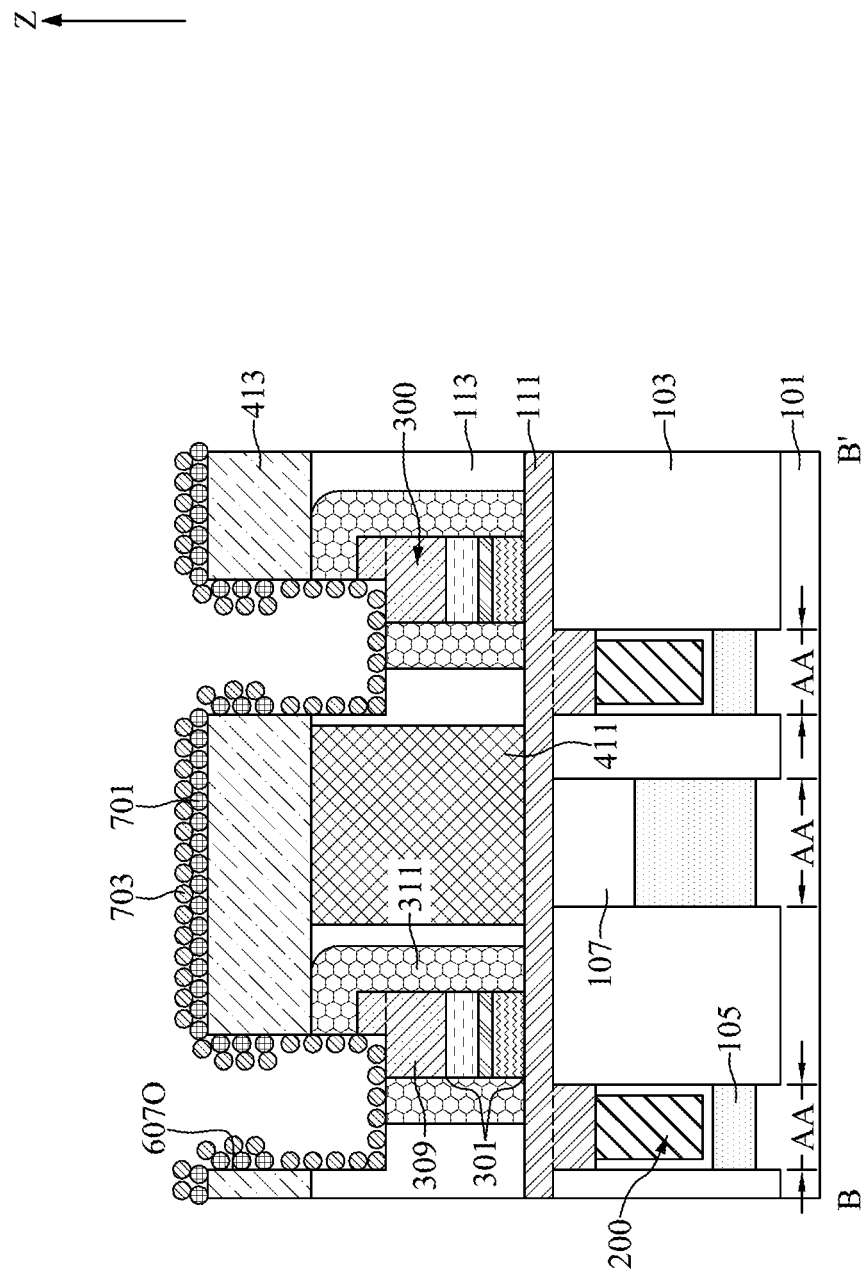
FIGS. 18 to 20 illustrate, in schematic cross-sectional view diagrams, part of the flow for fabricating the semiconductor device in accordance with one embodiment of the present disclosure.
Figure 19:
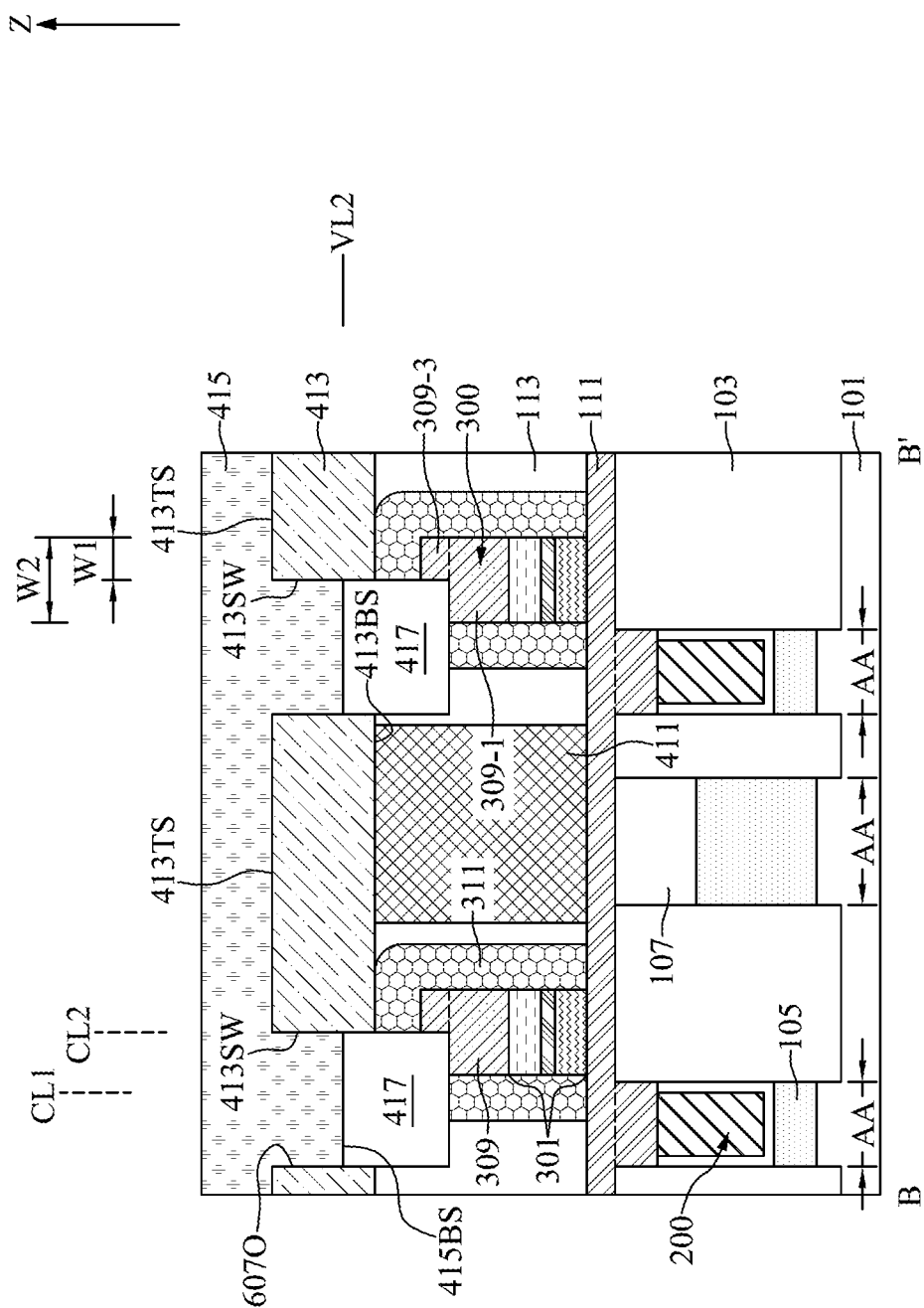
Figure 20:
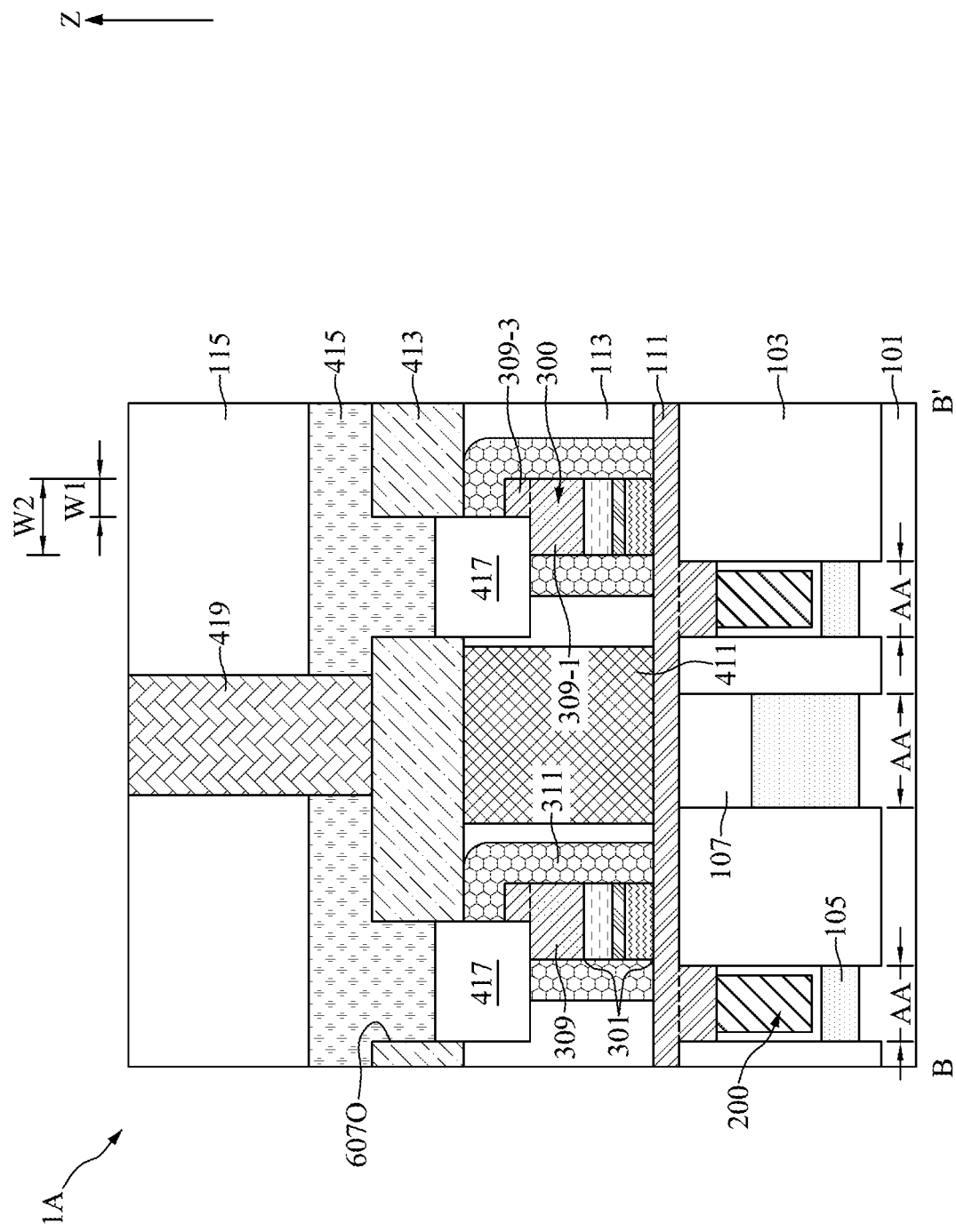

FIG. 17 is a chart showing an example of process conditions for forming a sealing layer 415 of the semiconductor device 1A in accordance with one embodiment of the present disclosure. FIGS. 18 to 20 illustrate, in schematic cross-sectional view diagrams, part of the flow for fabricating the semiconductor device 1A in accordance with one embodiment of the present disclosure.

With reference to FIG. 1 and FIGS. 17 to 20, at step S17, the sealing layer 415 may be formed to seal the plurality of pad openings 607O and form a plurality of air gaps 417, and a plurality of capacitor contacts 419 may be formed on the plurality of landing pads 413.

For brevity, clarity, and convenience of description, only one air gap 417 is described.

With reference to FIGS. 17, 18, and 19, the sealing layer 415 may be formed of silicon nitride. The sealing layer 415 may be formed by a first deposition process. The first deposition may be an atomic layer deposition process. Generally, the atomic layer deposition process alternately supplies two (or more) different source gases one by one onto a process object under predetermined process conditions, so that chemical species from the source gases are adsorbed to the process object at a single atomic layer level, and are deposited on the process object through surface reactions. For instance, a first source gas and a second source gas are alternately suppled to a process object to flow along the surface thereof, thereby molecules (or chemical species) contained in the first source gas adsorb to the surface of the process object, and molecules (or chemical species) contained in the second source gas react with the adsorbed molecules originated from the first source gas to form a film of a thickness of a single molecule level. The above process steps are performed repeatedly, so that a high-quality film may be formed on the process object.

In some embodiments, in the atomic layer deposition process of the present embodiment, the supply of the first source gas may be limited so that the first precursor molecules 701 in the first source gas only adsorb on the upper portion of the pad opening 607O and the top surface of the landing pad 413. As a result, the film formed by the second precursor molecules 703 in the second source gas react with the adsorbed first precursor molecules 701 may only locate on the upper portion of the pad opening 607O (i.e., the upper portion of the sidewall 413SW of the landing pad 413) and the top surface of the landing pad 413 and may not locate on the lower portion of the pad opening 607O. In some embodiments, the limited supply of first source gas may be achieved by precisely controlling the transferring time of the first source gas. For example, the transferring time of the first source gas may be between about 0.15 s and about 0.50 s, between 0.15 s and about 0.30 s, or about 0.2 s. In some embodiments, the limited supply of first source gas may be achieved by controlling the flow rate of the first source gas.

In some embodiments, the first deposition process may include a first silicon precursor supplying step 501 and a first nitrogen precursor supplying step 503 performed sequentially. In the first silicon precursor supplying step 501, a first silicon precursor (i.e., the first source gas) may be supplied to the reaction chamber and the chemical species from the first silicon precursor (e.g., the first precursor molecules 701) may be adsorbed to the surface of upper portion of the pad opening 607O and the top surface of the landing pad 413 at a single atomic layer level. In the first nitrogen precursor supplying step 503, a first nitrogen precursor (i.e., the second source gas) may be activated and supplied to the reaction chamber and the chemical species contained in the first nitrogen precursor (e.g., the second precursor molecules 703) may react with the adsorbed chemical species originated from the first silicon precursor to form a silicon nitride film of a thickness of a single molecule level. The silicon nitride film may be formed on the upper portion of the pad opening 607O and the top surface of the landing pad 413.

The first silicon precursor supplying step 501 may include a stabilizing stage, a flowing stage, and a purging and vacuuming stage.

With reference to FIGS. 17, 18, and 19, in the stabilizing stage of the first silicon precursor supplying step 501, a dilution gas (or a carrier gas) such as nitrogen gas may be supplied to the reaction chamber. A flow rate of the dilution gas may be between about 0.3 slm (standard liter per minute) and about 0.7 slm. For example, in the present embodiment, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the present embodiment, the process temperature of the stabilizing stage may be 400° C. A process pressure of the stabilizing stage may be between about 200 Pa and about 600 Pa, between about 300 Pa and about 500 Pa, or between about 350 Pa and about 450 Pa. For example, the in the present embodiment, the process pressure of the stabilizing stage may be 400 Pa.

With reference to FIGS. 17, 18, and 19, in the flowing stage of the first silicon precursor supplying step 501, the first silicon precursor may be supplied to the reaction chamber while the dilution gas is suppling. The chemical species from the first silicon precursor may be adsorbed to the upper portion of the pad opening 607O and the top surface of the landing pad 413 at a single atomic layer level. In some embodiments, the first silicon precursor may include a halide, such as iodine (I) or chlorine (Cl). In the present embodiment, the first silicon precursor may be, for example, dichlorosilane. The reaction between the first silicon precursor and the adsorbed surface (i.e., the upper portion of the pad opening 607O and the top surface of the landing pad 413) may be shown in Formula 1. In some embodiments, the first silicon precursor may include, for example, silicon tetrachloride, trichlorosilane, dichlorosilane, or hexachlorodisilane. In some embodiments, the first silicon precursor may include, for example, silicon tetraiodide, triiododsilane, diiodosilane, iodosilane, disilicon hexaiodide, trisilicon octaiodide, $H_2Si_2I_4$, $H_3Si_2I_3$, $H_4Si_2I_2$, $H_5Si_2I$, or $HSi_2I_5$. In some embodiments, the first silicon precursor may include one of triododsilane, diiodosilane, iodosilane, $H_2Si_2I_4$, $H_4Si_2I_2$, and $H_5Si_2I$. In some embodiments, the first silicon precursor may include two, three, four, five or six of triododsilane, diiodosilane, iodosilane, $H_2Si_2I_4$, $H_4Si_2I_2$, and $H_5Si_2I$, including any combinations thereof.

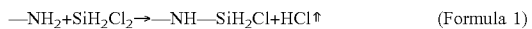

$$—NH_2+SiH_2Cl_2 \rightarrow —NH—SiH_2Cl+HCl\uparrow \qquad \text{(Formula 1)}$$

With reference to FIGS. 17, 18, and 19, in the flowing stage of the first silicon precursor supplying step 501, a flow rate of the first silicon precursor may be between about 1 slm and about 5 slm or between about 3 slm and about 4.5 slm. For example, in the present embodiment, the flow rate of the first silicon precursor may be 1 slm. If the flow rate of the first silicon precursor is lower than 1 slm, the amount of the first silicon precursor may be not sufficient to supply to nitrogen atoms on the adsorbed surface. If the flow rate of the first silicon precursor is greater than 5 slm, the chemical species contained in the first silicon precursor may adsorb on the lower portion of the pad opening 607O so that the formed silicon nitride film may cover the lower portion of the pad opening 607O. As a result, the space of the air gap 417 may be reduced due to the formed silicon nitride film located on the lower portion of the pad opening 607O. A flow rate of the dilution gas may be between about 0.3 slm and about 0.7 slm. For example, in the present embodiment, the flow rate of the dilution gas may be 0.5 slm.

With reference to FIGS. 17, 18, and 19, in the flowing stage of the first silicon precursor supplying step 501, a process temperature of the flowing stage may be between about 200° C. and about 550° C. For example, in the present embodiment, the process temperature of the flowing stage may be about 400° C. If the process temperature is lower than 200° C., the chemical species from the first silicon precursor may not adsorb to the adsorbed surface. If the process temperature is greater than 550° C., the reliability of word line structures 200 may be affected. In some embodiments, the process temperature of the flowing stage may be between about 390° C. and about 410° C. By using aforementioned temperature range, the deposition rate may be increased, and various characteristics, such as thickness uniformity, wet etch resistance property and film stress, of the resultant silicon nitride layer may be improved.

With reference to FIGS. 17, 18, and 19, in the flowing stage of the first silicon precursor supplying step 501, a process pressure of the flowing stage may be between about 400 Pa and about 1200 Pa, between about 600 Pa and about 1100 Pa, or between about 800 Pa and about 1000 Pa. For example, the in the present embodiment, the process pressure of the flowing stage may be 850 Pa. By using aforementioned pressure range, the reaction rate between nitrogen atoms and first silicon precursor may be increased and the pressure may be readily regulated.

With reference to FIGS. 17, 18, and 19, in the purging and vacuuming stage of the first silicon precursor supplying step 501, the supply of the first silicon precursor may be stopped. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

In some embodiments, the first nitrogen precursor supplying step 503 may include a stabilizing stage, a flowing stage, and a purging and vacuuming stage.

With reference to FIGS. 17, 18, and 19, in the stabilizing stage of the first nitrogen precursor supplying step 503, a dilution gas such as nitrogen gas may be supplied to the reaction chamber. A flow rate of the dilution gas may be between about 0.3 slm and about 0.7 slm. For example, in the present embodiment, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the present embodiment, the process temperature of the stabilizing stage may be 400° C. A process pressure of the stabilizing stage may be between about 10 Pa and about 70 Pa, between about 20 Pa and about 60 Pa, or between about 30 Pa and about 50 Pa. For example, the in the present embodiment, the process pressure of the stabilizing stage may be 50 Pa.

With reference to FIGS. 17, 18, and 19, in the flowing stage of the first nitrogen precursor supplying step 503, the first nitrogen precursor may be activated in a plasma generating unit and then supplied to the reaction chamber while the dilution gas is suppling. The chemical species contained in the activated first nitrogen precursor may react with the adsorbed chemical species originated from the first silicon precursor to form the silicon nitride film on the adsorbed surface. The first nitrogen precursor may be, for example, ammonia gas.

With reference to FIGS. 17, 18, and 19, in the flowing stage of the first nitrogen precursor supplying step 503, a radio frequency (RF) in the plasma generating unit may be turned on to activate the first nitrogen precursor. A radio frequency power of the flowing stage may be between about 50 W and about 1000 W or between about 100 W and about 300 W. If the radio frequency power of the flowing stage is greater than 1000 W, the quarts walls of the plasma generating unit may be damaged. A radio frequency power density of the flowing stage may be between about 0.02 W/cm$^2$ and about 2.0 W/cm$^2$ or between about 0.05 W/cm$^2$ and about 1.5 W/cm$^2$. The process frequency of the plasma generating unit may be between about 10.00 MHz and about 15.00 MHz. For example, in the present embodiment, the process frequency of the plasma generating unit in the flowing stage may be 13.56 MHz. In the embodiment depicted, the activated first nitrogen precursors may be ammonia radicals (NH$_3$*). The activated first nitrogen precursor may be supplied to the reaction chamber in the form of plasma.

With reference to FIGS. 17, 18, and 19, in the flowing stage of the first nitrogen precursor supplying step 503, a flow rate of the activated first nitrogen precursor may be between about 0.5 slm and about 5 slm or between 3 slm and about 5 slm. By using the aforementioned flow rate range, the plasma of activated first nitrogen precursor may be readily generated and the amount of the activated first nitrogen precursor may be sufficient to react with the adsorbed chemical species originated from the first silicon precursor. In the present embodiment, the flow rate of the activated first nitrogen precursor may be, for example, 3 slm. It should be noted that the dilution gas may be still supplied in the flowing stage and a flow rate of the dilution gas may be between about 0.3 slm and about 0.7 slm. For example, in the embodiment depicted, the flow rate of the dilution gas may be still 0.5 slm.

With reference to FIGS. 17, 18, and 19, in the flowing stage of the first nitrogen precursor supplying step 503, a process pressure in the reaction chamber may be between about 40 Pa and about 100 Pa or between about 50 Pa and about 70 Pa. For example, in the present embodiment, the process pressure in the reaction chamber may be 50 Pa. A process pressure in the plasma generating unit may be between about 70 Pa and about 600 Pa or between about 280 Pa and about 330 Pa. By using the aforementioned process pressure range in the plasma generating unit, the plasma of activated first nitrogen precursor may be readily generated and the amount of the activated first nitrogen precursor may be sufficient to react with the adsorbed chemical species originated from the first silicon precursor.

With reference to FIGS. 17, 18, and 19, in the flowing stage of the first nitrogen precursor supplying step 503, reactions between the activated first nitrogen precursor and the adsorbed chemical species originated from the first silicon precursor may be shown in Formula 2 and Formula 3.

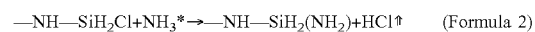
—NH—SiH$_2$Cl+NH$_3$*→—NH—SiH$_2$(NH$_2$)+HCl↑ (Formula 2)

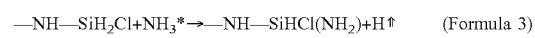
—NH—SiH$_2$Cl+NH$_3$*→—NH—SiHCl(NH$_2$)+H↑ (Formula 3)

In some embodiments, the transferring time of the first nitrogen precursor may be between about 0.40 s and about 0.70 s, between 0.45 s and about 0.65 s, or about 0.6 s.

With reference to FIGS. 17, 18, and 19, in the purging and vacuuming stage of the first nitrogen precursor supplying step 503, the supply of the first nitrogen precursor may be stopped and the radio frequency of the plasma generating unit may be turned off. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

After the first deposition process, one layer of the silicon nitride film may be formed. The first deposition process may be repeated for plural times (only shown four times for clarity) to form layers of the silicon nitride film of desired thickness. The layers of the silicon nitride film of desired thickness may be referred to as the sealing layer 415. In some embodiments, the repeat times of the first deposition process may be between about 20 and about 60, between about 30 and about 50, or between about 34 and 40. The sealing layer 415 may cover the upper portion of the pad opening 607O and the top surface of the landing pad 413. The pad opening 607O may be sealed by the sealing layer 415, and the sealed pad opening 607O may be referred to as the air gap 417. In some embodiments, the bottom surface 415BS of the sealing layer 415 is at a vertical level VL2 between the top surface 413TS of the landing pad 413 and the bottom surface 413BS of the landing pad 413.

In some embodiments, a planarization process, such as chemical mechanical polishing, may be optionally performed to provide a substantially flat surface for subsequent processing steps.

In some embodiments, the center line CL1 of the air gap 417 and may be misaligned with a center line CL2 of the bit line structure 300.

In some embodiments, the air gap 417 may be formed between the landing pad 413 and the bit line conductive layer 301, and adjacent to the upper portion 309-3 of the bit line inner capping layer 309. The width W1 of the upper portion 309-3 of the bit line inner capping layer 309 may be less than the width W2 of the bit line conductive layer 301.

With reference to FIG. 20, a third dielectric layer 115 may be formed on the sealing layer 415. The third dielectric layer 115 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the third dielectric layer 115 may include a self-planarizing material such as a spin-on glass or a spin-on low-k dielectric material such as SiLK™. In some embodiments, the third dielectric layer 115 may be formed by a deposition process including, for example, chemical vapor deposition, plasma enhanced chemical vapor deposition, evaporation, or spin-on coating.

For brevity, clarity, and convenience of description, only one capacitor contact 419 is described and shown in FIG. 20.

With reference to FIG. 20, the capacitor contact 419 may be formed along the third dielectric layer 115, along the sealing layer 415, and on the landing pad 413. The capacitor contact 419 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The capacitor contact 419 may be formed by, for example, a damascene method.

One aspect of the present disclosure provides a semiconductor device including a substrate; a drain region positioned in the substrate; a common source region positioned in the substrate and opposing to the drain region; a bit line structure including a bit line conductive layer positioned on the substrate and electrically coupled to the common source region; a cell contact positioned on the substrate, adjacent to the bit line structure, and electrically connected to the drain region; a landing pad positioned above the bit line conductive layer and electrically connected to the cell contact; and an air gap positioned between the landing pad and the bit line conductive layer.

Another aspect of the present disclosure provides a semiconductor device including a bit line structure including: a bit line conductive layer, and a bit line inner capping layer including a lower portion positioned on the bit line conductive layer and an upper portion positioned on the lower portion; a landing pad positioned above the bit line inner capping layer; and an air gap positioned between the landing pad and the bit line conductive layer, and adjacent to the upper portion of the bit line inner capping layer. A width of the upper portion of the bit line inner capping layer is less than a width of the bit line conductive layer.

Another aspect of the present disclosure provides a method for fabricating a semiconductor device including providing a substrate; forming a bit line conductive layer on the substrate and a bit line inner capping layer on the bit line conductive layer, wherein the bit line conductive layer and the bit line inner capping layer together configure a bit line structure; forming a bit line spacer capping layer covering the bit line structure; forming a cell contact adjacent to the bit line structure; forming a blanket pad layer on the bit line spacer capping layer and the cell contact; forming a plurality of pad openings along the blanket pad layer and extending to the bit line spacer capping layer and the bit line inner capping layer to turn the blanket pad layer into a plurality of landing pads; and selectively forming a sealing layer on the plurality of landing pads and covering upper portions of the plurality of pad openings to form a plurality of air gaps between the bit line conductive layer and the plurality of landing pads.

Due to the design of the semiconductor device of the present disclosure, the air gap 417 may be formed between the landing pad 413 and the bit line conductive layer 301. As a result, the parasitic capacitance between the landing pad 413 and the bit line conductive layer 301 may be reduced. Accordingly, the power consumption of the semiconductor device 1A may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a drain region positioned in the substrate;
a common source region positioned in the substrate and opposing to the drain region;
a bit line structure comprising:
a bit line conductive layer positioned on the substrate and electrically coupled to the common source region;
a cell contact positioned on the substrate, adjacent to the bit line structure, and electrically connected to the drain region;
a landing pad positioned above the bit line conductive layer and electrically connected to the cell contact;
an air gap positioned between the landing pad and the bit line conductive layer; and
a capacitor contact positioned on the landing pad and electrically connected to the landing pad;
wherein the bit line structure comprises:
a bit line inner capping layer positioned on a top surface of the bit line conductive layer, and a portion of the bit line inner capping layer is exposed to the air gap.

2. The semiconductor device of claim 1, further comprising a sealing layer positioned on the landing pad and sealing the air gap.

3. The semiconductor device of claim 1, wherein the bit line structure comprises:
a bit line spacer capping layer covering the bit line inner capping layer and the bit line conductive layer, and a portion of the bit line spacer capping layer is exposed to the air gap.

4. The semiconductor device of claim 3, wherein the bit line spacer capping layer is a stacked layer structure consisting of silicon oxide-silicon nitride-silicon oxide.

5. The semiconductor device of claim 4, wherein a bottom surface of the sealing layer is at a vertical level between a top surface of the landing pad and a bottom surface of the landing pad.

6. The semiconductor device of claim 5, wherein the bit line conductive layer comprises:
a bottom conductive portion positioned on the substrate and electrically coupled to the common source region;
a middle conductive portion positioned on the bottom conductive portion and electrically connected to the bottom conductive portion; and
a top conductive portion positioned between the middle conductive portion and the bit line inner capping layer, and electrically connected to the middle conductive portion.

7. The semiconductor device of claim 6, further comprising a word line structure positioned in the substrate and between the drain region and the common source region.

8. The semiconductor device of claim 7, wherein the word line structure extends along a first direction in a top view perspective, and the bit line structure extends along a second direction, and the first direction and the second direction are perpendicular to each other.

9. The semiconductor device of claim 8, wherein the word line structure comprises:
a word line insulating layer inwardly positioned in the substrate and between the drain region and the common source region;
a word line conductive layer positioned on the word line insulating layer and electrically insulate from the drain region and the common source region by the word line insulating layer; and
a word line capping layer positioned on the word line conductive layer.

10. The semiconductor device of claim 9, further comprising a bit line contact positioned between the bit line structure and the common source region to electrically couple the bit line structure and the common source region.

11. The semiconductor device of claim 10, further comprising a well region positioned under the drain region and the common source region.

12. The semiconductor device of claim 11, wherein a center line of the air gap is misaligned with a center line of the bit line structure.

13. A semiconductor device, comprising:
a bit line structure comprising:
a bit line conductive layer; and
a bit line inner capping layer comprising a lower portion positioned on a top surface of the bit line conductive layer and an upper portion positioned on the lower portion;
a landing pad positioned above the bit line inner capping layer; and
an air gap positioned between the landing pad and the bit line conductive layer, and adjacent to the upper portion of the bit line inner capping layer;
wherein a width of the upper portion of the bit line inner capping layer is less than a width of the bit line conductive layer;
a sealing layer covering a top surface of the landing pad and an upper portion of a sidewall of the landing pad;
wherein the air gap is enclosed by the sealing layer;
wherein the lower portion and the upper portion of the bit line inner capping layer are exposed to the air gap.

14. The semiconductor device of claim 13, wherein the sealing layer comprises silicon nitride.

15. The semiconductor device of claim 13, wherein the bit line structure comprises:
a bit line spacer capping layer covering the bit line conductive layer and a portion of the bit line inner capping layer, and exposing to the air gap.

16. The semiconductor device of claim 15, wherein the bit line inner capping layer comprises silicon nitride and the bit line spacer capping layer is a stacked layer structure consisting of silicon oxide-silicon nitride-silicon oxide.

17. The semiconductor device of claim 16, wherein the landing pad comprises tungsten, cobalt, zirconium, tantalum, titanium, aluminum, ruthenium, copper, metal carbides, metal nitrides, transition metal aluminides, or a combination thereof.

* * * * *